(12) United States Patent
Harada et al.

(10) Patent No.: US 9,218,993 B2
(45) Date of Patent: Dec. 22, 2015

(54) METHOD OF MANUFACTURING SEMICONDUCTOR DEVICE AND METHOD OF PROCESSING SUBSTRATE

(75) Inventors: Kazuhiro Harada, Toyama (JP); Hideharu Itatani, Toyama (JP)

(73) Assignee: HITACHI KOKUSAI ELECTRIC, INC., Tokyo (JP)

( * ) Notice: Subject to any disclaimer, the term of this patent is extended or adjusted under 35 U.S.C. 154(b) by 809 days.

(21) Appl. No.: 13/213,434

(22) Filed: Aug. 19, 2011

(65) Prior Publication Data

US 2012/0045903 A1 Feb. 23, 2012

(30) Foreign Application Priority Data

Aug. 19, 2010 (JP) ................. 2010-184237
Jun. 13, 2011 (JP) ................. 2011-131509

(51) Int. Cl.
| | |
|---|---|
| H01L 21/31 | (2006.01) |
| C23C 16/52 | (2006.01) |
| C23C 16/46 | (2006.01) |
| C23C 16/34 | (2006.01) |
| C23C 16/455 | (2006.01) |
| H01L 21/67 | (2006.01) |
| C23C 16/56 | (2006.01) |
| H01L 21/677 | (2006.01) |
| H01L 45/00 | (2006.01) |

(52) U.S. Cl.
CPC ............ *H01L 21/6719* (2013.01); *C23C 16/34* (2013.01); *C23C 16/56* (2013.01); *H01L 21/67748* (2013.01); *H01L 45/04* (2013.01); *H01L 45/145* (2013.01); *H01L 45/1616* (2013.01)

(58) Field of Classification Search
CPC .... C23C 16/34; C23C 16/56; H01L 21/6719; H01L 45/1616; H01L 45/04; H01L 45/145; H01L 21/67748
USPC ...................................... 438/785; 257/E21.24
See application file for complete search history.

(56) References Cited

U.S. PATENT DOCUMENTS

| | | | |
|---|---|---|---|
| 6,180,542 B1 | 1/2001 | Hwang | |
| 6,458,645 B2 * | 10/2002 | DeBoer et al. | ................ 438/240 |

(Continued)

FOREIGN PATENT DOCUMENTS

| | | |
|---|---|---|
| JP | 08-293494 A | 11/1996 |
| JP | 2000-195859 A | 7/2000 |
| JP | 2003-092361 A | 3/2003 |

(Continued)

*Primary Examiner* — Walter H Swanson
(74) *Attorney, Agent, or Firm* — Volpe and Koenig, P.C.

(57) ABSTRACT

Provided is a method of forming a tantalum oxide-based film having good step coverage while controlling an oxygen concentration in the film. The method includes forming a tantalum nitride layer on a substrate by supplying a source gas including a tantalum and a nitriding agent into a process chamber wherein the substrate is accommodated under a condition where a chemical vapor deposition (CVD) reaction is caused; oxidizing the tantalum nitride layer by supplying an oxidizing agent into the process chamber under a condition where an oxidation reaction of the tantalum nitride layer by the oxidizing agent is unsaturated; and forming on the substrate a conductive tantalum oxynitride film wherein an oxygen is stoichiometrically insufficient with respect to the tantalum and a nitrogen by alternately repeating forming the tantalum nitride layer on the substrate and oxidizing the tantalum nitride layer a plurality of times.

14 Claims, 16 Drawing Sheets

(56) References Cited

U.S. PATENT DOCUMENTS

| | | |
|---|---|---|
| 6,551,873 B2 | 4/2003 | Park et al. |
| 7,691,758 B2 | 4/2010 | Iwaki |

FOREIGN PATENT DOCUMENTS

| | | | |
|---|---|---|---|
| JP | 2008-053318 A | | 3/2008 |
| JP | 2008-288436 | * | 11/2008 |
| JP | 2008-288436 A | | 11/2008 |
| KR | 1020010004751 | * | 1/2001 |
| KR | 1020010004751 A | | 1/2001 |
| KR | 10-2001-0094343 A | | 10/2001 |
| KR | 10-2002-0011126 A | | 2/2002 |
| KR | 10-0328454 A | | 2/2002 |
| KR | 10-2003-0063643 A | | 7/2003 |
| KR | 10-2005-0076982 A | | 7/2005 |
| KR | 1020050076982 | * | 7/2005 |

* cited by examiner

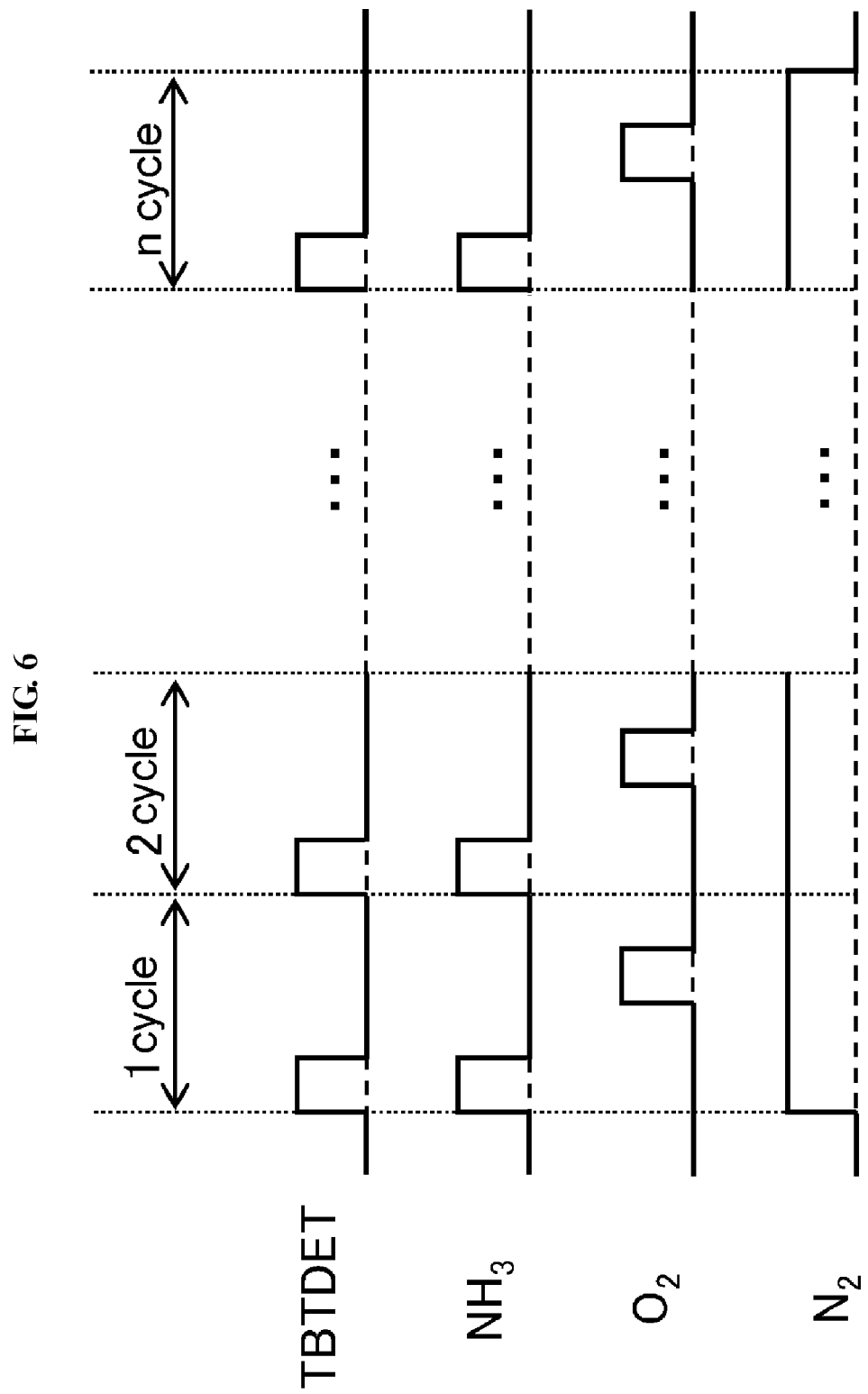

METHOD OF MANUFACTURING SEMICONDUCTOR DEVICE AND METHOD OF PROCESSING SUBSTRATE

CROSS-REFERENCE TO RELATED PATENT APPLICATION

This U.S. non-provisional patent application claims priority under 35 U.S.C. §119 of Japanese Patent Application No. 2010-184237, filed on Aug. 19, 2010, and No. 2011-131509, filed on Jun. 13, 2011, in the Japanese Patent Office, the entire contents of which are hereby incorporated by reference.

BACKGROUND OF THE INVENTION

1. Field of the Invention

The present invention relates to a method of manufacturing a semiconductor device including a process of processing a substrate in a process chamber, a method of processing a substrate, and a substrate processing apparatus preferably used in the process.

2. Description of the Related Art

As new random access memories (RAMs) that can be substituted for dynamic random access memories (DRAMs), for example, a capacitor-less DRAM using a silicon on insulator (SOI) substrate (SOI-type RAM), a magneto-resistive RAM (MRAM), a phase change RAM (PRAM), a resistive RAM (ReRAM), and so on, may be exemplified.

Among these, the ReRAM has a capacitor structure in which a thin film formed of a transition metal oxide (hereinafter, a transition metal oxide film) is disposed between metal electrodes, and uses variation in resistance of the transition metal oxide film generated by applying a voltage between the metal electrodes (variation in electric field induction resistance) as memory information. Since the ReRAM has a low consumption power of $\frac{1}{1000}$ or less per one bit, compared to that of a conventional NOR-type flash memory, and a read-out time and a re-writing time, both of which are a high speed of about 10 ns, the ReRAM is receiving attention as a next-generation non-volatile memory.

In the ReRAM, a tantalum oxide-based film such as a tantalum oxide (TaOx) film is used as a transition metal oxide film to enable control of an oxygen concentration in a film. In a development step of a ReRAM device, a method of forming a tantalum oxide film is mainly performed by a physical vapor deposition (PVD) method. However, since the transition metal oxide film requires high step coverage due to a structure of the ReRAM, the PVD method cannot be easily applied to mass production.

SUMMARY OF THE INVENTION

In order to solve the problems, it is an object of the present invention to provide a method of manufacturing a semiconductor device, a method of processing a substrate and a substrate processing apparatus that are capable of controlling oxygen concentration in a film and forming a tantalum oxide-based film having good step coverage.

According to an aspect of the present invention, there is provided a method of manufacturing a semiconductor device, which includes:

forming a tantalum nitride layer on a substrate by supplying a source gas including a tantalum and a nitriding agent into a process chamber wherein the substrate is accommodated under a condition where a chemical vapor deposition (CVD) reaction is caused;

oxidizing the tantalum nitride layer by supplying an oxidizing agent into the process chamber under a condition where an oxidation reaction of the tantalum nitride layer by the oxidizing agent is unsaturated; and forming on the substrate a conductive tantalum oxynitride film wherein an oxygen is stoichiometrically insufficient with respect to the tantalum and a nitrogen by alternately repeating forming the tantalum nitride layer on the substrate and oxidizing the tantalum nitride layer a plurality of times.

According to another aspect of the present invention, there is provided a method of processing a substrate, which includes:

forming a tantalum nitride layer on a substrate by supplying a source gas including a tantalum and a nitriding agent into a process chamber wherein the substrate is accommodated under a condition where a chemical vapor deposition (CVD) reaction is caused;

oxidizing the tantalum nitride layer by supplying an oxidizing agent into the process chamber under a condition where an oxidation reaction of the tantalum nitride layer by the oxidizing agent is unsaturated; and forming on the substrate a conductive tantalum oxynitride film wherein an oxygen is stoichiometrically insufficient with respect to the tantalum and a nitrogen by alternately repeating forming the tantalum nitride layer on the substrate and oxidizing the tantalum nitride layer a plurality of times.

According to still another aspect of the present invention, there is provided a substrate processing apparatus, which includes:

a process chamber configured to accommodate a substrate;

a heater configured to heat the substrate in the process chamber;

a source gas supply system configured to supply a source gas including a tantalum into the process chamber;

a nitriding agent supply system configured to supply a nitriding agent into the process chamber;

an oxidizing agent supply system configured to supply an oxidizing agent into the process chamber; and a control unit configured to control the heater, the source gas supply system, the nitriding agent supply system and the oxidizing agent supply system to perform forming a tantalum nitride layer on the substrate by supplying the source gas and the nitriding agent into the process chamber wherein the substrate is accommodated under a condition where a chemical vapor deposition (CVD) reaction is caused; oxidizing the tantalum nitride layer by supplying the oxidizing agent into the process chamber under a condition where an oxidation reaction of the tantalum nitride layer by the oxidizing agent is unsaturated; and forming on the substrate a conductive tantalum oxynitride film wherein an oxygen is stoichiometrically insufficient with respect to the tantalum and a nitrogen by alternately repeating forming the tantalum nitride layer on the substrate and oxidizing the tantalum nitride layer a plurality of times.

Effects of the Invention

According to the present invention, it is possible to provide a method of manufacturing a semiconductor device, a method of processing a substrate and a substrate processing apparatus that are capable of controlling oxygen concentration in a film and forming a tantalum oxide-based film having good step coverage.

BRIEF DESCRIPTION OF THE DRAWINGS

FIG. 6 is a timing chart of gas supply in a film forming process in accordance with an embodiment of the present invention, showing an example in which oxygen gas is solely supplied as an oxidizing agent;

DETAILED DESCRIPTION OF THE PREFERRED EMBODIMENTS (1) Configuration of Substrate Processing Apparatus First, configuration of a substrate processing apparatus in accordance with an embodiment of the present invention will be described with reference to FIGS. 3 and 4.

<Process Chamber>

Figure 3:
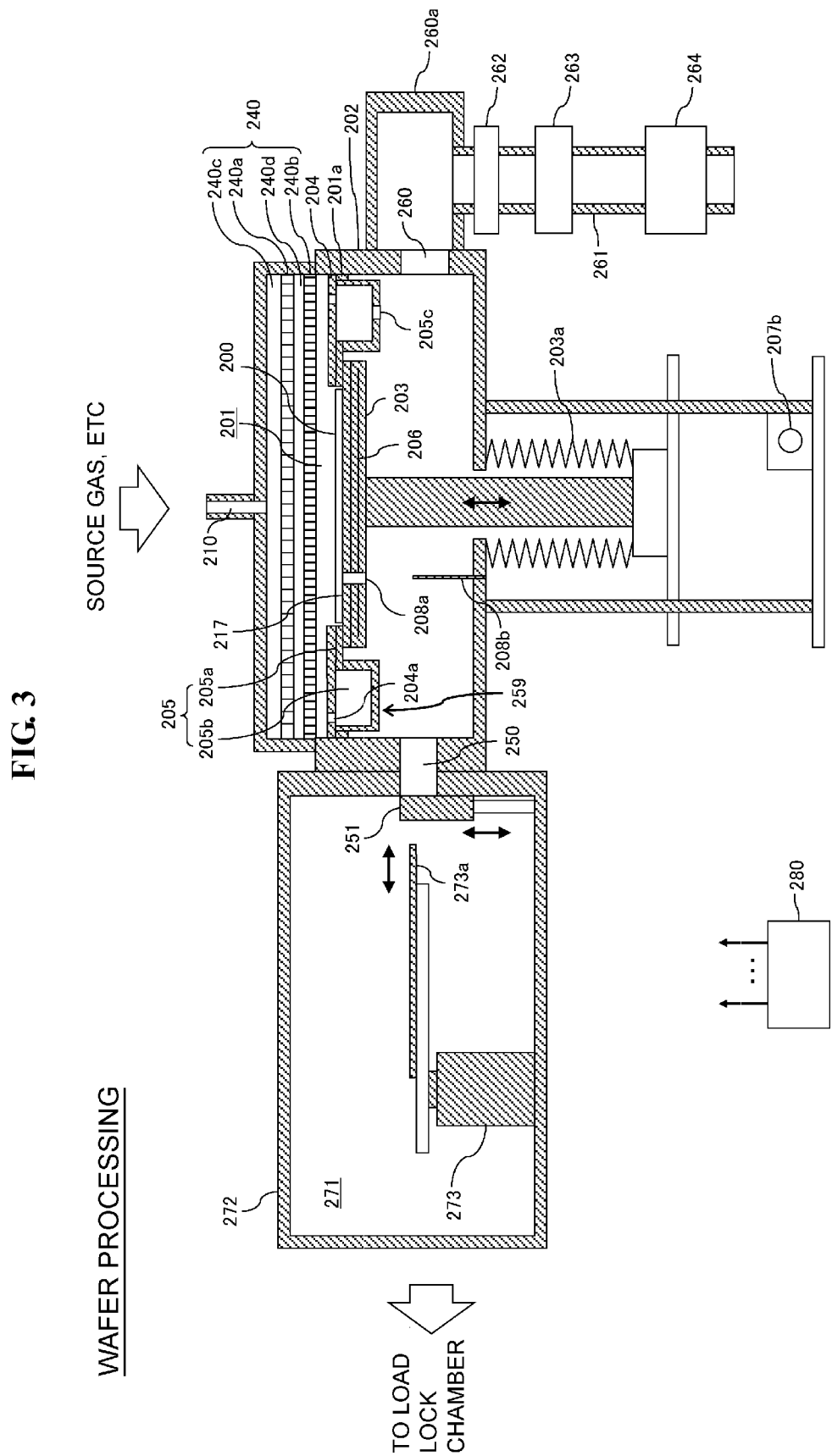
FIG. 3 is a cross-sectional view of the substrate processing apparatus in accordance with an embodiment of the present invention when a wafer is processed.
Figure 4:
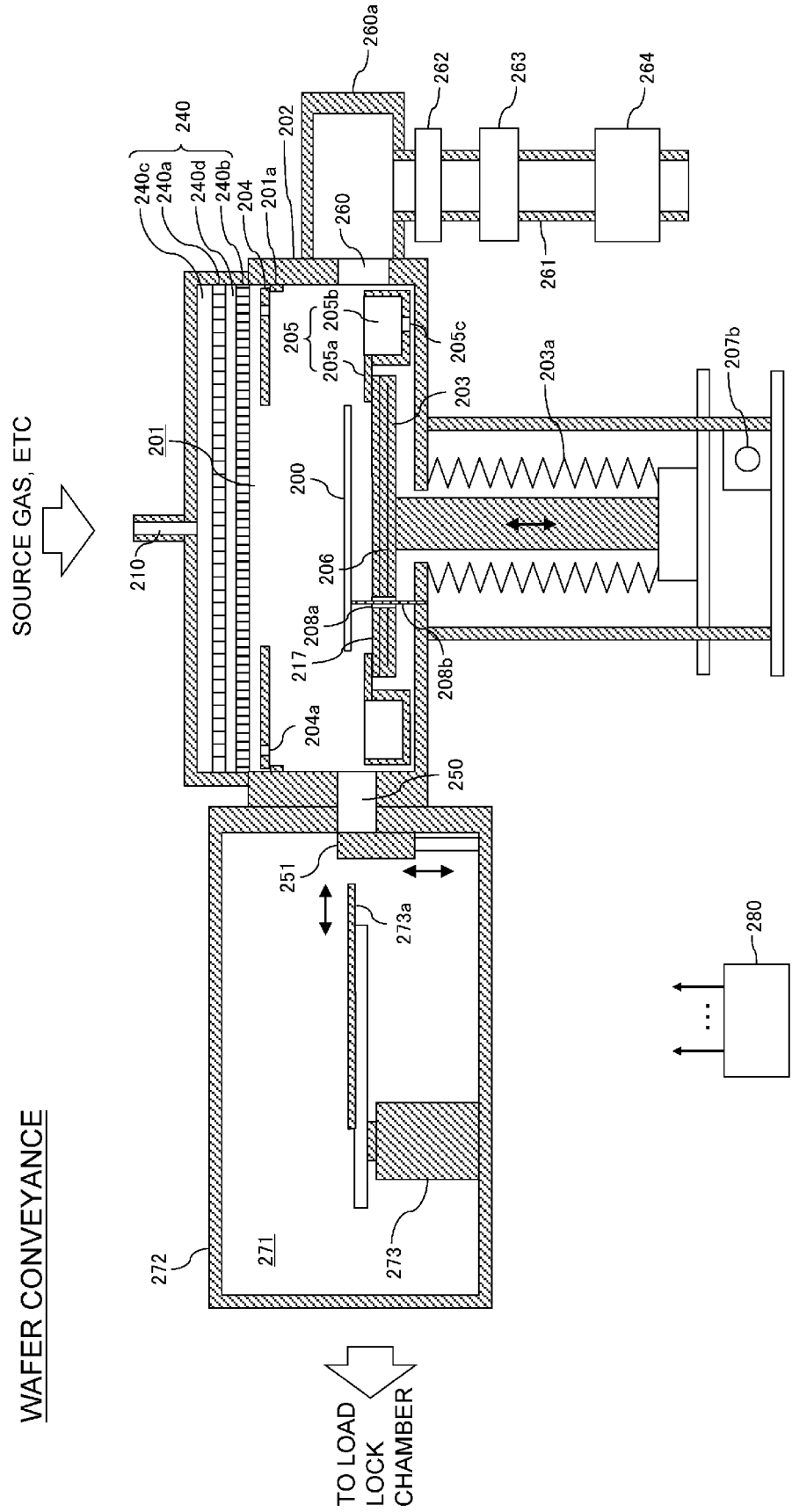
FIG. 4 is a cross-sectional view of the substrate processing apparatus in accordance with an embodiment of the present invention when the wafer is conveyed.

As shown in FIGS. 3 and 4, the substrate processing apparatus in accordance with an embodiment of the present invention includes a process vessel 202. The process vessel 202 is constituted by a flat sealing vessel having a circular horizontal cross-section. In addition, the process vessel 202 is formed of a metal material such as aluminum (Al) or stainless steel (SUS). In the process vessel 202, a process chamber 201 is formed to process a wafer 200 such as a silicon wafer, which is a substrate.

<Support Frame>

A support frame 203 configured to support the wafer 200 is installed in the process chamber 201. A susceptor 217, which is a support plate formed of quartz ($SiO_2$), carbon, ceramics, silicon carbide (SiC), aluminum oxide ($Al_2O_3$), or aluminum nitride (AlN), is installed at an upper surface of the support frame 203 in direct contact with the wafer 200. In addition, a heater 206 is mounted in the support frame 203 as a heating means (heating source) configured to heat the wafer 200. Further, a lower end of the support frame 203 passes through a bottom portion of the process vessel 202.

<Elevation Mechanism>

An elevation mechanism 207b configured to elevate the support frame 203 is installed outside the process chamber 201. As the elevation mechanism 207b is operated to raise or lower the support frame 203, the wafer 200 supported on the susceptor 217 can be raised or lowered. The support frame 203 is lowered to a position shown in FIG. 4 when the wafer 200 is conveyed (wafer conveyance position), and is raised to a position shown in FIG. 3 when the wafer 200 is processed (wafer processing position). In addition, a periphery of the lower end of the support frame 203 is covered by a bellows 203a to hermetically hold an inside of the process chamber 201.

<Lift Pin>

Further, for example, three lift pins 208b are vertically installed on a lower surface (bottom surface) of the process chamber 201 in a vertical direction. Furthermore, the support frame 203 (including also the susceptor 217) has through-holes 208a, through which the lift pins 208b pass, formed respectively at positions corresponding to the lift pins 208b. Then, when the support frame 203 is lowered to the wafer conveyance position, as shown in FIG. 4, upper ends of the lift pins 208b project from an upper surface of the susceptor 217 such that the lift pins 208b support the wafer 200 from its lower side. In addition, when the support frame 203 is raised to the wafer processing position, as shown in FIG. 3, the lift pins 208b are withdrawn from the upper surface of the susceptor 217 such that the susceptor 217 supports the wafer 200 from a lower side thereof. Further, since the lift pins 208b are in direct contact with the wafer 200, the lift pins 208b may be formed of a material such as quartz or alumina.

<Wafer Conveyance Port>

A wafer conveyance port 250 is installed in a side surface of an inner wall of the process chamber 201 (process vessel 202) to convey the wafer from/into the process chamber 201. A gate valve 251 is installed at the wafer conveyance port 250, and when the gate valve 251 is opened, an inside of the process chamber 201 is in communication with an inside of a conveyance chamber 271 (preliminary chamber). The conveyance chamber 271 is formed in the conveyance vessel 272 (sealing vessel), and a conveyance robot 273 is installed in the conveyance chamber 271 to convey the wafer 200. The conveyance robot 273 includes a conveyance arm 273a configured to support the wafer 200 when the wafer 200 is conveyed. With the support frame 203 lowered to the wafer conveyance position, as the gate valve 251 is opened, the wafer 200 can be conveyed between the inside of the process chamber 201 and the inside of the conveyance chamber 271 by the conveyance robot 273. The wafer 200 conveyed into the process chamber 201 is temporarily placed on the lift pins 208b as described above. In addition, a load lock chamber (not shown) is installed at a side of the conveyance chamber 271 opposite to a side thereof at which the wafer conveyance port 250 is installed, and the wafer 200 can be conveyed between the load lock chamber and the conveyance chamber 271 by the conveyance robot 273. Further, the load lock chamber acts as a preliminary chamber configured to temporarily accommodate the wafer 200, which is not processed or which is completely processed.

<Exhaust System>

An exhaust port 260 configured to exhaust an atmosphere in the process chamber 201 is installed at a side surface of an inner wall of the process chamber 201 (process vessel 202) and an opposite side of the wafer conveyance port 250. An exhaust pipe 261 is connected to the exhaust port 260 via an exhaust chamber 260a, and a pressure regulator 262 such as an automatic pressure controller (APC) configured to control the inside of the process chamber 201 to a predetermined pressure, a source collection trap 263, and a vacuum pump 264 are sequentially and serially connected to the exhaust pipe 261. An exhaust system (exhaust line) is mainly constituted by the exhaust port 260, the exhaust chamber 260a, the exhaust pipe 261, the pressure regulator 262, the source collection trap 263, and the vacuum pump 264.

<Gas Introduction Port>

A gas introduction port 210 is installed at an upper surface (ceiling surface) of a shower head 240 (described later) installed on the process chamber 201 to supply various gases into the process chamber 201. In addition, configuration of a gas supply system connected to the gas introduction port 210 will be described later.

<Shower Head>

A shower head 240, which is a gas distribution mechanism, is installed between the gas introduction port 210 and the process chamber 201. The shower head 240 includes a distribution plate 240a configured to distribute a gas introduced from the gas introduction port 210, and a shower plate 240b configured to more evenly distribute the gas passed through the distribution plate 240a to supply the gas onto the surface of the wafer 200 on the support frame 203. A plurality of air vent holes are formed in the distribution plate 240a and the shower plate 240b. The distribution plate 240a is disposed to oppose an upper surface of the shower head 240 and the shower plate 240b, and the shower plate 240b is disposed to oppose the wafer 200 on the support frame 203. In addition, spaces are defined between the upper surface of the shower head 240 and the distribution plate 240a and between the distribution plate 240a and the shower plate 240b, respectively, and the spaces act as a first buffer space 240a (distribution chamber) to distribute a gas supplied from the gas introduction port 210, and a second buffer space 240d to diffuse a gas passed through the distribution plate 240a, respectively.

<Exhaust Duct>

A step portion 201a is installed at a side surface of the inner wall of the process chamber 201 (process chamber 202). In addition, the step portion 201a is configured to hold a conductance plate 204 near the wafer processing position. The conductance plate 204 is constituted by one sheet of a doughnut-shaped (ring-shaped) disc having holes configured to accommodate the wafers 200 formed in an inner circumference thereof. A plurality of discharge ports 204a are installed at an outer circumference of the conductance plate 204 at predetermined intervals in a circumferential direction thereof. The discharge ports 204a are discontinuously formed such that the outer circumference of the conductance plate 205 supports the inner circumference of the conductance plate 204.

Meanwhile, a lower plate 205 is latched by the outer circumference of the support frame 203. The lower plate 205 includes a concave part 205b having a ring shape, and a flange part 205a integrally installed on an inner side of the concave part 205b. The concave part 205b is installed to close a gap between the outer circumference of the support frame 203 and the side surface of the inner wall of the process chamber 201. A plate exhaust port 205c is installed at a portion of the bottom portion of the concave part 205b near the exhaust port 260 to discharge (flow) the gas from the inside of the concave part 205b toward the exhaust port 260. The flange part 205b functions as a latch part latched on an upper outer circumference of the support frame 203. As the flange part 205a is latched on the upper outer circumference of the support frame 203, the lower plate 205 is raised or lowered with the support frame 203 as the support frame 203 is raised or lowered.

When the support frame 203 is raised to the wafer processing position, the lower plate 205 is also raised to the wafer processing position. As a result, the conductance plate 204 held near the wafer processing position closes an upper surface portion of the concave part 205b of the lower plate 205, and an exhaust duct 259 is formed to use the inside of the concave part 205b as a gas flow path region. In addition, at this time, the inside of the process chamber 201 is divided into an upper portion of the process chamber over the exhaust duct 259 and a lower portion of the process chamber under the exhaust duct 259 by the exhaust duct 259 (the conductance plate 204 and the lower plate 205) and the support frame 203. Further, the conductance plate 204 and the lower plate 205 may be formed of a material that can hold a high temperature, for example, quartz for high temperature resistance and high load, in consideration of etching (self cleaning) of by-products accumulated on the inner wall of the exhaust duct 259.

Here, a flow of the gas in the process chamber 201 when the wafer is processed will be described. First, the gas supplied from the gas introduction port 210 to an upper part of the shower head 240 passes through a first buffer space 240c (dispersion chamber) to enter a second buffer space 240d via a plurality of holes of the dispersion plate 240a, and passes through a plurality of holes of the shower plate 240b to be supplied into the process chamber 201, being uniformly supplied onto the wafer 200. Then, the gas supplied onto the wafer 200 radially flows outward in a radial direction of the wafer 200. Next, the gas remaining after contact with the wafer 200 radially flows along the exhaust duct 259 disposed as the outer circumference of the wafer 200, i.e., on the conductance plate 204, outward in the radial direction of the wafer 200, and is discharged to an inside of the gas flow path region (the inside of the concave part 205b) in the exhaust duct 259 through the discharge port 204a installed at the conductance plate 204. Thereafter, the gas flows through the exhaust duct 259 to be exhausted to the exhaust port 260 via the plate exhaust port 205c. As the gas flows as described above, mixing and introduction of the gas to a lower portion of the process chamber, i.e., a rear surface of the support frame 203 or a lower surface of the process chamber 201, is suppressed.

<Gas Supply System>

Figure 2:
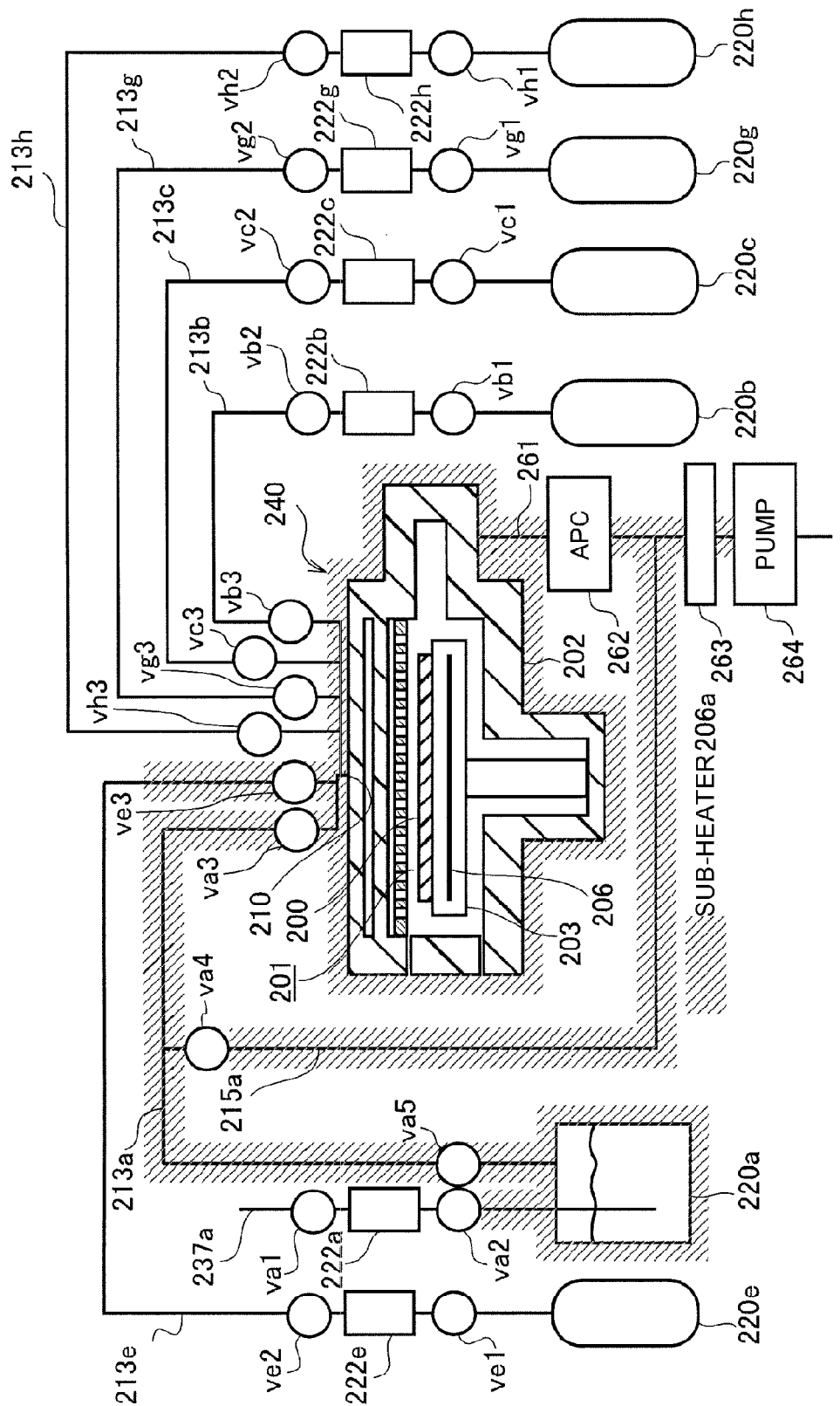
FIG. 2 is a configuration view of a gas supply system and an exhaust system included in a substrate processing apparatus in accordance with an embodiment of the present invention.

Next, configuration of the gas supply system connected to the gas introduction port 210 will be described with reference to FIG. 2. FIG. 2 is a configuration view of the gas supply system and the exhaust system included in the substrate processing apparatus in accordance with an embodiment of the present invention.

The gas supply system included in the substrate processing apparatus in accordance with an embodiment of the present invention includes a bubbler 220a acting as a vaporizer configured to vaporize a liquid source including tantalum (Ta), which is in a liquid phase at a normal temperature, a source gas supply system configured to supply a source gas obtained by vaporizing the liquid source from the bubbler 220a into the process chamber 201, a nitriding agent supply system configured to supply a nitriding agent into the process chamber 201, an oxidizing agent supply system configured to supply an oxidizing agent into the process chamber 201, and a purge gas supply system configured to supply a purge gas into the process chamber 201. In addition, the substrate processing apparatus in accordance with an embodiment of the present invention includes a vent (bypass) system configured to allow the source gas from the bubbler 220a to bypass the process chamber 201, not supplying the source gas into the process chamber 201. Hereinafter, configuration of each part will be described.

<Bubbler>

The bubbler 220a, which is a source vessel to accommodate a liquid source, is installed at the outside of the process chamber 201. The bubbler 220a is constituted by a tank (sealing vessel) in which a liquid source can be accommodated (charged), and constituted by a vaporizer configured to vaporize the liquid source through bubbling to generate a source gas. In addition, a sub-heater 206a configured to heat the bubbler 220a and the liquid source therein is installed around the bubbler 220a. Organic metal liquid sources including tantalum atoms such as tris(diethylamino)tertiarybutyliminotantalum (TBTDET, $Ta[NC(CH_3)_3][N(C_2H_5)_2]_3$), tris(ethylmethylamino)tertiarybutyliminotantalum (TBTEMT, $Ta[NC(CH_3)_3][N(C_2H_5)CH_3]_3$), or tris(dimethylamino)tertiarybutyliminotantalum (TBTDMT, $Ta[NC(CH_3)_3][N(CH_3)_2]_3$) may be used as the source. The TBTDET, TBTEMT and TBTDMT may be sources including a butylimino group, that is, a tertiarybutylimino group, and may also be sources including at least one of an ethyl group and a methyl group, and an amino group. Considering elements constituting the sources, these sources may include tantalum (Ta), nitrogen (N), carbon (C), and hydrogen (H). Tantalum pentachloride ($TaCl_5$), tantalum pentafluoride ($TaF_5$), or pentaetoxytantalum ($Ta(OC_2H_5)_5$) may be used as the sources, in addition to the above-mentioned examples of the sources. In this embodiment, TBTDET, which is an organic source, is used as the source.

A carrier gas supply pipe 237a is connected to the bubbler 220a. A carrier gas supply source (not shown) is connected to an upstream-side end of the carrier gas supply pipe 237a. In addition, a downstream-side end of the carrier gas supply pipe 237 is dipped in the liquid source accommodated in the bubbler 220a. A mass flow controller (MFC) 222a, which is a flow rate controller configured to control a supply flow rate of a carrier gas, and valves va1 and va2 configured to control supply of the carrier gas are installed at the carrier gas supply pipe 237a. Further, a gas that cannot react with the liquid source, for example, an inert gas such as $N_2$ gas, Ar gas and He gas, may be used as the carrier gas. A carrier gas supply system (carrier gas supply line) is mainly constituted by the carrier gas supply pipe 237a, the MFC 222a, and the valves va1 and va2.

According to the above configuration, the valves va1 and va2 are opened to supply the carrier gas flowed from the carrier gas supply pipe 237a and flow rate-controlled by the MFC 222a into the bubbler 220a and vaporize the liquid source accommodated in the bubbler 220a through bubbling, enabling generation of a source gas (TBTDET gas).

<Source Gas Supply System>

A source gas supply pipe 213a is connected to the bubbler 220a to supply a source gas generated in the bubbler 220a into the process chamber 201. An upstream-side end of the source gas supply pipe 213a is in communication with a space above the bubbler 220a. A downstream-side end of the source gas supply pipe 213a is connected to the gas introduction port 210. Valves va5 and va3 are sequentially installed at the source gas supply pipe 213a from the upstream side. The valve va5 is configured to control supply of the source gas into the source gas supply pipe 213a, and installed near the bubbler 220a. The valve va3 is configured to control supply of the source gas from the source gas supply pipe 213a into the process chamber 201, and installed near the gas introduction port 210. A valve ve3 (described later) and the valve va3 are constituted as a high-durable high-speed gas valve. The high-durable high-speed gas valve is an integrated valve configured to rapidly perform switching of gas supply and gas exhaustion for a short time. In addition, the valve ve3 is configured to rapidly purge a space between the valve va3 of the source gas supply pipe 213a and the gas introduction port 210, and then, control introduction of a purge gas purging the inside of the process chamber 201.

According to the above configuration, the bubbler 220a can vaporize the liquid source to generate the source gas, and the valves va5 and va3 can be opened to supply the source gas from the source gas supply pipe 213a into the process chamber 201. A source gas supply system (source gas supply line) is mainly constituted by the source gas supply pipe 213a and the valves va5 and va3.

In addition, a source supply system (source supply line) is mainly constituted by the carrier gas supply system, the bubbler 220a and the source gas supply system.

<Nitriding Agent Supply System>

Further, a nitrogen-containing gas supply source 220b is installed outside of the process chamber 201 to supply a nitrogen-containing gas (reducing gas), which is a nitriding agent. An upstream-side end of a nitrogen-containing gas supply pipe 213b is connected to the nitrogen-containing gas supply source 220b. A downstream-side end of the nitrogen-containing gas supply pipe 213b is connected to the gas introduction port 210 via the valve vb3. An MFC 222b, which is a flow rate controller configured to control a supply flow rate of a nitrogen-containing gas, and valves vb1, vb2 and vb3 configured to control supply of the nitrogen-containing gas are installed at the nitrogen-containing gas supply pipe 213b. Ammonia ($NH_3$) gas, diazine ($N_2H_2$) gas, hydrazine ($N_2H_4$) gas, or $N_3H_8$ gas may be used as the nitrogen-containing gas, and in this embodiment, ammonia ($NH_3$) gas may be used. A nitrogen-containing gas supply system (nitrogen-containing gas supply line), which is a nitriding agent supply system, is mainly constituted by the nitrogen-containing gas supply source 220b, the nitrogen-containing gas supply pipe 213b, the MFC 222b, and the valves vb1, vb2 and vb3.

<Oxidizing Agent Supply System>

In addition, an oxygen-containing gas supply source 220g is installed at the outside of the process chamber 201 to supply an oxygen-containing gas. An upstream-side end of an oxygen-containing gas supply pipe 213g is connected to the oxygen-containing gas supply source 220g. A downstream-side end of the oxygen-containing gas supply pipe 213g is connected to the gas introduction port 210 via a valve vg3. An MFC 222g, which is a flow rate controller configured to control a supply flow rate of an oxygen-containing gas, and valves vg1, vg2 and vg3 configured to control supply of the oxygen-containing gas are installed at the oxygen-containing gas supply pipe 213g. Oxygen ($O_2$) gas, ozone ($O_3$) gas or vapor ($H_2O$) may be used as the oxygen-containing gas, and in this embodiment, oxygen ($O_2$) gas may be used.

Further, a hydrogen-containing gas supply source 220h is installed outside of the process chamber 201 to supply a hydrogen-containing gas. An upstream-side end of a hydrogen-containing gas supply pipe 213h is connected to the hydrogen-containing gas supply source 220h. A downstream-side end of the hydrogen-containing gas supply pipe 213h is connected to the gas introduction port 210 via a valve vh3. An MFC 222h, which is a flow rate controller configured to control a supply flow rate of a hydrogen-containing gas, and valves vh1, vh2 and vh3 configured to control supply of the hydrogen-containing gas are installed at the hydrogen-containing gas supply pipe 213h. Hydrogen ($H_2$) gas, deuterium ($D_2$) gas, ammonia ($NH_3$) gas, or methane ($CH_4$) gas may be, for example, used as the hydrogen-containing gas, and in this embodiment, hydrogen ($H_2$) gas may be used.

An oxygen-containing gas supply system (oxygen-containing gas supply line) is mainly constituted by the oxygen-containing gas supply source 220g, the oxygen-containing gas supply pipe 213g, the MFC 222g, and the valves vg1, vg2 and vg3. In addition, a hydrogen-containing gas supply system (hydrogen-containing gas supply line) is mainly constituted by the hydrogen-containing gas supply source 220h, the hydrogen-containing gas supply line 213h, the MFC 222h, and the valves vh1, vh2 and vh3. Further, an oxidizing agent supply system (oxidizing agent supply line) is mainly constituted by the oxygen-containing gas supply system, or the oxygen-containing gas supply system and the hydrogen-containing gas supply system. Only an oxygen-containing gas, or a mixed gas of an oxygen-containing gas and a hydrogen-containing gas (for example, $O_2+H_2$) may be used as the oxidizing agent. Furthermore, when the hydrogen-containing gas is not added to the oxygen-containing gas, i.e., the oxygen-containing gas is used solely as the oxidizing agent, the hydrogen-containing gas supply system may not be installed.

<Purge Gas Supply System>

In addition, purge gas supply sources 220c and 220e are installed outside of the process chamber 201. Upstream-side ends of purge gas supply pipes 213c and 213e are connected to the purge gas supply sources 220c and 220e, respectively. A downstream-side end of the purge gas supply pipe 213c is connected to the gas introduction port 210 via a valve vc3. A downstream-side end of the purge gas supply pipe 213e joins between the valve va3 of the source gas supply pipe 213a and the gas introduction port 210 to be connected to the gas introduction port 210. MFCs 222c and 222e, which are flow rate controllers configured to a supply flow rate of a purge gas, and valves vc1, vc2, vc3, ve1, ve2 and ve3 configured to control supply of the purge gas are installed at the purge gas supply pipes 213c and 213e. An inert gas such as $N_2$ gas, Ar gas or He gas may be used as the purge gas. A purge gas supply system (purge gas supply line) is mainly constituted by the purge gas supply sources 220c and 220e, the purge gas supply pipes 213c and 213e, the MFCs 222c and 222e, and the valves vc1, vc2, vc3, ve1, ve2 and ve3.

<Vent (Bypass) System>

In addition, an upstream-side end of a vent pipe 215a is connected to the source gas supply pipe 213a at an upstream-side of the valve va3. Further, a downstream-side end of the vent pipe 215a is connected to the exhaust pipe 261 at a downstream-side of the pressure regulator 262 and an upstream-side of the source collection trap 263. A valve va4 is installed at the vent pipe 215a to control a flow of the gas.

According to the configuration, the valve va3 is closed and the valve va4 is opened such that the gas flowing through the source gas supply pipe 213a can be exhausted through the exhaust pipe 261, not being supplied into the process chamber 210 but bypassing the process chamber 201 via the vent pipe 215a. A vent line is mainly constituted by the vent pipe 215a and the valve va4.

Further, while a sub-heater 206a is installed around the bubbler 22a as described above, sub-heaters 206a are also installed around the carrier gas supply pipe 237a, the source gas supply pipe 213a, the purge gas supply pipe 213e, the vent pipe 215a, the exhaust pipe 261, the process vessel 202, the shower head 240, and so on. The sub-heaters 206a are configured to prevent re-liquefaction of the source gas in these members by heating the members to a temperature ranging from 100° C. or lower.

<Control Unit>

The substrate processing apparatus in accordance with an embodiment of the present invention includes a controller 280, which is a control unit, to control operations of each part of the substrate processing apparatus. The controller 280 controls operations of the gate valve 251, the elevation mechanism 207b, the conveyance robot 273, the heater 206, the sub heater 206a, the pressure regulator (APC) 262, the vacuum pump 264, the valves va1 to va5, vb1 to vb3, vc1 to vc3, ve1 to ve3, vg1 to vg3, and vh1 to vh3, and the MFCs 222a, 222b, 222c, 222e, 222g and 222h.

(2) Substrate Processing Process

Figure 1:
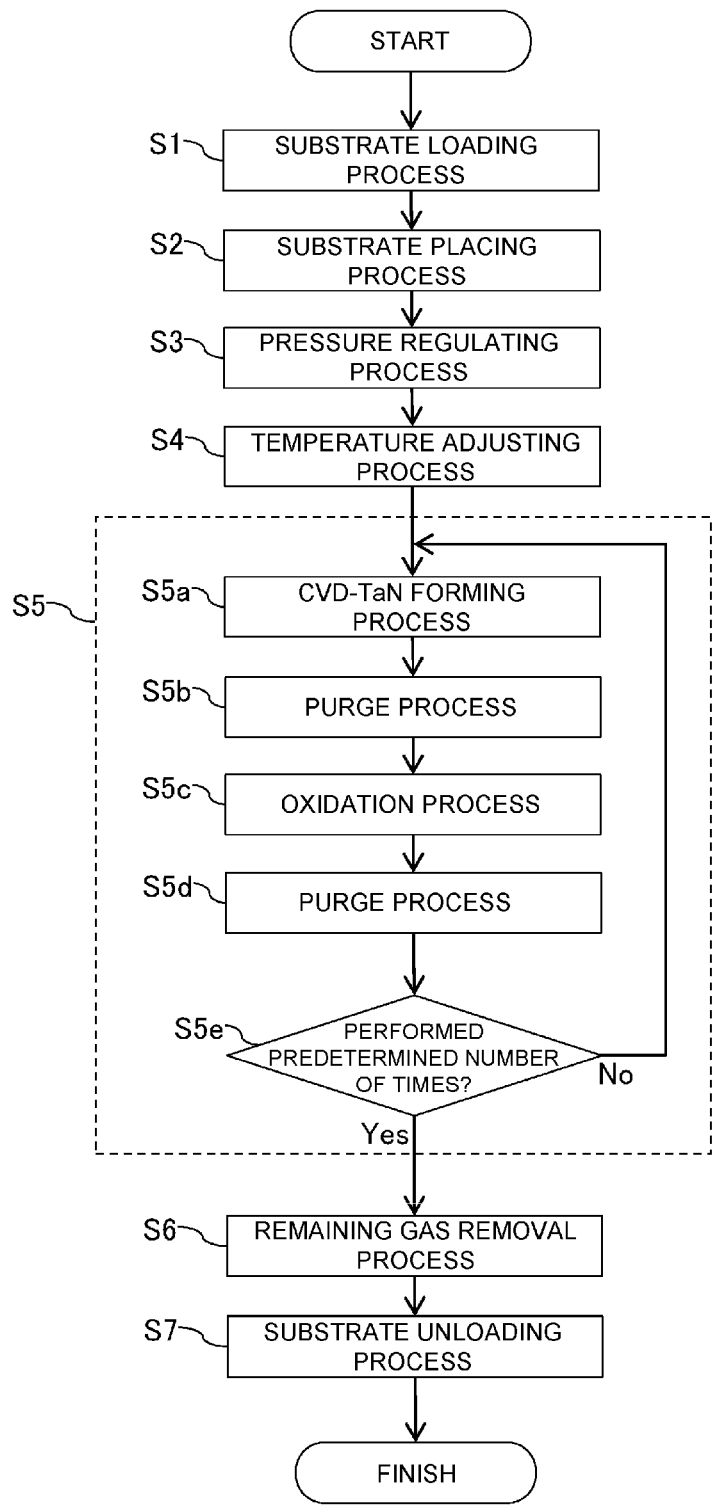
FIG. 1 is a flowchart of a substrate processing process in accordance with an embodiment of the present invention.

Next, as one of processes of manufacturing a semiconductor device, a substrate processing process of forming a tantalum oxynitride film, which stoichiometrically lacks oxygen with respect to tantalum and nitrogen, as a tantalum oxide-based film, on the wafer 200 in the process chamber 201 using the above-described substrate processing apparatus will be described with reference to FIGS. 1 and 6. FIG. 1 is a flowchart of the substrate processing process in accordance with an embodiment of the present invention. FIG. 6 is a timing chart of supply of a gas in a film forming process in accordance with an embodiment of the present invention. In addition, in the following description, an operation of each part constituting the substrate processing apparatus is controlled by the controller 280.

Further, here, an example including a process of forming on the wafer 200 a conductive tantalum oxynitride film ($TaN_xO_y$ film) wherein oxygen (O) is stoichiometrically insufficient with respect to tantalum (Ta) and nitrogen (N), by alternately repeating the following processes a plurality of times: a process of forming a tantalum nitride layer (CVD-TaN layer) on the wafer 200 by supplying TBTDET gas, which is a source gas including tantalum, and $NH_3$ gas, which is a nitriding agent, into the process chamber 201 in which the wafer 200 is accommodated, under conditions in which a CVD reaction is caused; and a process of oxidizing the CVD-TaN layer by supplying $O_2$ gas, which is an oxidizing agent, into the process chamber 201 under conditions in which an oxidation reaction of the CVD-TaN layer by the oxidizing agent is unsaturated; will be described.

<Substrate Loading Process (S1) and Substrate Placing Process (S2)>

First, the elevation mechanism 207b is operated to lower the support frame 203 to the wafer loading position as shown in FIG. 4. Then, the gate valve 251 is opened to communicate the process chamber 201 with the conveyance chamber 271. Next, the wafer to be processed 200 is loaded from the conveyance chamber 271 into the process chamber by the conveyance robot 273 with the wafer 200 supported by the conveyance arm 273a (S1). The wafer 200 loaded into the process chamber 201 is temporarily placed on the lift pins 208b projecting from the upper surface of the support frame 203. When the conveyance arm 273 of the robot 273 is returned from the process chamber 201 into the conveyance chamber 271, the gate valve 251 is closed.

Then, the elevation mechanism 207b is operated to raise the support frame 203 to the wafer processing position as shown in FIG. 3. As a result, the lift pins 208b are buried from the upper surface of the support frame 203, and the wafer 200 is placed on the susceptor 217 on the upper surface of the support frame 203 (S2).

<Pressure Regulation Process (S3) and Temperature Adjustment Process (S4)>

Next, the pressure regulator (APC) 262 controls the pressure in the process chamber 201 to reach a predetermined pressure (S3). In addition, a power supplied to the heater 206 is adjusted such that a surface temperature of the wafer 200 is controlled to be a predetermined processing temperature (S4). Further, the temperature adjustment process (S4) may be performed in parallel with the pressure regulation process (S3) or may be performed before the pressure regulation process (S3). Here, the predetermined processing temperature and processing pressure are a processing temperature and a processing pressure at which the CVD-TaN layer can be formed by means of the CVD method in the following CVD-TaN layer forming process (S5a). That is, they are a processing temperature and a processing pressure at a level in which a source used in the CVD-TaN layer forming process (S5a) is self-decomposed. The predetermined processing temperature and processing pressure described herein are a processing temperature and a processing pressure at which the CVD-TaN layer formed on the wafer 200 is oxidized in the following oxidizing process (S5c).

Further, in the substrate loading process (S1), the substrate placing process (S2), the pressure regulation process (S3), and the temperature adjustment process (S4), with the vacuum pump 264 being operated, the valves va3, vb3, vg3 and vh3 are closed and the valves vc1, vc2, vc3, ve1, ve2 and ve3 are opened such that $N_2$ gas always flows in the process chamber 201. Accordingly, attachment of particles to the wafer 200 can be suppressed.

Parallel to the processes S1 to S4, the source (TBTDET) is vaporized to generate a source gas (TBTDET gas) (preliminary vaporization). That is, as the valves va1, va2 and va5 are opened to supply the carrier gas whose flow rate is controlled by the MFC 222a from the carrier gas supply pipe 237a into the bubbler 220a, the source accommodated in the bubbler 220a is vaporized through bubbling to generate a source gas (preliminary vaporization process). In the preliminary vaporization process, as the vacuum pump 264 is operated to close the valve va3 and open the valve va4, the source gas bypasses the process chamber 201 to be exhausted, not supplying the source gas into the process chamber 201. In order to stably generate the source gas from the bubbler, a predetermined time is needed. For this reason, in this embodiment, as the source gas is pre-generated and opening/closing of the valves va3 and va4 are switched, a flow path of the source gas is switched. As a result, according to the switching of the valves, stable supply of the source gas into the process chamber 201 can be rapidly initiated or stopped.

<Film Forming Process (S5)>

[CVD-TaN Layer Forming Process (S5a)]

Then, with the vacuum pump 264 in operation, the valve va4 is closed and the valve va3 is opened, and supply of the source gas (TBTDET gas) into the process chamber 201 is initiated. The source gas is dispersed by the shower head 240 to be uniformly supplied onto the wafer 200 in the process chamber 201. The remaining source gas flows in the exhaust duct 259 to be exhausted to the exhaust port 260 and the exhaust pipe 261. In addition, simultaneously, with the vacuum pump 264 in operation, the valves vb1, vb2 and vb3 are opened, and supply of the nitrogen-containing gas ($NH_3$ gas), which is a nitriding agent, into the process chamber 201 is initiated. Further, supply of the nitrogen-containing gas may be initiated before supply of the source gas. That is, before the source gas and the nitrogen-containing gas are simultaneously supplied, a process of releasing only the nitrogen-containing gas (first nitrogen-containing gas purge process) may be performed. The nitrogen-containing gas is dispersed by the shower head 240 to be uniformly supplied onto the wafer 200 in the process chamber 201. The remaining nitrogen-containing gas flows in the exhaust duct 259 to be exhausted through the exhaust port 260 and the exhaust pipe 261. In addition, the nitrogen-containing gas is mixed with the source gas from the shower head 240. That is, a mixed gas of the nitrogen-containing gas and the source gas is supplied from the shower head 240, and the mixed gas is uniformly supplied to the wafer 200.

At this time, since the processing temperature (wafer temperature) and the processing pressure (pressure in the process chamber) reach a processing temperature and a processing pressure such that the source gas is self-decomposed, in the inside of the process chamber 201 and the surface of the wafer 200, a gas phase reaction between the source gas and the nitrogen-containing gas occurs. As a result, the CVD-TaN layer, which is a tantalum nitride layer, is formed on the wafer 200 due to the CVD reaction between the source gas and the nitrogen-containing gas, not a pyrolyzed tantalum layer formed by the source gas, which is solely self-decomposed.

As described above, in the CVD-TaN layer forming process (S5a), under conditions in which the CVD reaction is caused, the source gas and the nitrogen-containing gas are supplied into the process chamber 201 in which the wafer 200 is accommodated, and exhausted therefrom to form the CVD-TaN layer, not the pyrolyzed tantalum layer, on the wafer 200.

A large amount of a carbon (C) element resulting from the source gas may be mixed as impurities into the pyrolyzed tantalum layer formed by the pyrolysis of the source gas. This tendency becomes remarkable when organic sources are used, in particular, when a source including a butyl imino group, i.e., a tertiary butyl imino group, is used. In addition, particularly, this tendency becomes remarkable when a source including a butyl imino group, i.e., a tertiary butyl imino group, an ethyl group or a methyl group, and an amino group is used. Further, the TBTDET is a source including a butyl imino group, an ethyl group and an amino group, the TBTEMT is a source including a butyl imino group, an ethyl group, a methyl group and an amino group, and the TBTDMT is a source including a butyl imino group, a methyl group and an amino group.

Here, in the embodiment, when the source gas is supplied into the process chamber 201, as the nitrogen-containing gas is additionally supplied, mixing of the related impurities into the tantalum layer can be suppressed, or the related impurities can be removed from the tantalum layer. That is, in forming the CVD-TaN layer on the wafer 200, i.e., performing the CVD reaction, mixing of the impurities into the CVD-TaN layer can be suppressed by an effect of the nitrogen-containing gas. Further, at this time, even when the pyrolyzed tantalum layer is temporarily formed on the wafer 200, since the nitrogen-containing gas can react with the pyrolyzed tantalum layer (nitridation reaction), the impurities mixed into the pyrolyzed tantalum layer can be removed during the reaction, and the CVD-TaN layer having a small amount of impurities can be formed. Then, a concentration of the impurities in the TaN$_x$O$_y$ film formed by the following predetermined-time-performed process (S5e) can be reduced. In addition, these actions become especially remarkable when the organic sources such as TBTDET, TBTEMT and TBTDMT are used as the sources.

The thickness of the CVD-TaN layer formed through the CVD-TaN layer forming process (S5a) is appropriately determined according to an oxidizing power of the oxidizing agent used in the following oxidation process (S5c) or an oxygen concentration, which is a target concentration of the TaN$_x$O$_y$ film. For example, provided that the oxidizing power is constant, when the thickness of the CVD-TaN layer is reduced, an oxidizing amount of the CVD-TaN layer during the oxidation process S5c can be increased, and the oxygen concentration of the TaN$_x$O$_y$ film formed through predetermined-time-performed process S5e can be increased. In addition, for example, similarly, provided that the oxidizing power is constant, when the thickness of the CVD-TaN layer is increased, an oxidizing amount of the CVD-TaN layer during the oxidation process S5c can be suppressed, and the oxygen concentration of the TaN$_x$O$_y$ film formed through the predetermined-time-performed process S5e can be reduced.

When the source gas and the nitrogen-containing gas are supplied into the process chamber 201, in order to promote diffusion of the source gas and the nitrogen-containing gas in the process chamber 201, N$_2$ gas may be constantly flown into the process chamber 201 with the valves ve1, ve2, ve3, vc1, vc2 and vc3 open.

After the supply of the source gas and the nitrogen-containing gas into the process chamber 201 is initiated, when a predetermined time elapses, the valve va3 is closed and the valve va4 is opened to stop the supply of the source gas into the process chamber 201, and the valves vb1, vb2 and vb3 are closed to stop the supply of the nitrogen-containing gas. In addition, the supply of the nitrogen-containing gas may be stopped after the supply of the source gas is stopped. That is, after the simultaneous supply of the source gas and the nitrogen-containing gas, a process of continuously releasing only the nitrogen-containing gas may be provided (a second nitrogen-containing gas purge process). As the first nitrogen-containing gas purge process or the second nitrogen-containing gas purge process is provided, a state in which only the source gas is in the process chamber 201 can be avoided, and formation of the pyrolyzed tantalum layer at an initial or final stage of the film-forming process can be prevented.

[Purge Process (S5b)]

After the valves va3, vb1, vb2 and vb3 are closed to stop the supply of the source gas and the nitrogen-containing gas, the valves vc1, vc2, vc3, ve1, ve2 and ve3 are maintained in an open state to continue the supply of N$_2$ gas into the process chamber 201. The N$_2$ gas is dispersed by the shower head 240 to be supplied into the process chamber 201, and flows in the exhaust duct 259 to be exhausted to the exhaust port 260 and the exhaust pipe 261. Accordingly, the source gas, the nitrogen-containing gas, and the by-products remaining in the process chamber 201 are removed, and the inside of the process chamber 201 is purged by the N$_2$ gas.

[Oxidation Process (S5c)]

After the inside of the process chamber 201 is purged, with the vacuum pump 264 in operation, the valves vg1, vg2 and vg3 are opened to initiate the supply of the oxidizing agent into the process chamber 201. As described above, in this embodiment, O$_2$ gas is solely used as the oxidizing agent. The oxidizing agent is dispersed by the shower head 240 to be uniformly supplied onto the wafer 200 in the process chamber 201. The remaining oxidizing agent flows in the exhaust duct 259 to be exhausted to the exhaust port 260 and the exhaust pipe 261. At this time, the oxidizing agent supplied onto the wafer 200 oxidizes the CVD-TaN layer formed on the wafer 200 such that the tantalum oxynitride layer (TaN$_x$O$_y$ layer) is formed on the wafer 200. Here, oxidation of the CVD-TaN layer is thermally performed under a non-plasma atmosphere, and performed under a condition where the oxidation reaction of the CVD-TaN layer by the oxidizing agent is unsaturated. In addition, while the oxidation of the CVD-TaN layer may be performed using plasma, in this case, unsaturation of the oxidation reaction of the CVD-TaN layer by the oxidizing agent becomes difficult. Meanwhile, when the oxidation of the CVD-TaN layer is thermally performed under a non-plasma atmosphere, the oxidation can be softly performed, and unsaturation of the oxidation reaction of the CVD-TaN layer by the oxidizing agent is easily accomplished.

Accordingly, in this embodiment, the oxidation of the CVD-TaN layer is thermally performed under the non-plasma atmosphere.

In addition, performance of the oxidation process (S5c) can reduce a nitrogen concentration in the CVD-TaN layer (i.e., the TaN$_x$O$_y$ layer), in addition to the oxidation of the CVD-TaN layer. That is, the oxidizing agent supplied onto the wafer 200 separates at least some of Ta—N bonds included in the CVD-TaN layer. Nitrogen (N) atoms from which tantalum (Ta) atoms are detached are removed from the CVD-TaN layer to be discharged as N$_2$. Further, dangling bonds of the tantalum atoms remaining after the detaching of the nitrogen atoms are coupled to oxygen (O) atoms included in the oxidizing agent. Thus, the nitrogen is removed from the CVD-TaN layer, and thus, a nitrogen concentration in the TaN$_x$O$_y$ film formed through predetermined-time-performed process S5e (described later) can be reduced.

Furthermore, removal of the nitrogen from the CVD-TaN layer can be promoted by increasing an oxidizing power of the oxidizing agent used in the oxidation process (S5c), lengthening an oxidizing time, or decreasing a thickness of the CVD-TaN layer formed through the CVD-TaN layer forming process (S5a). Accordingly, a TaOx layer having a composition having no nitrogen can be formed, and a TaOx film can be formed through predetermined-time-performed process (S5e). In this case, a conductive tantalum oxide film (TaOx film), in which oxygen (O) is stoichiometrically insufficient with respect to tantalum (Ta), is formed.

When the oxidizing agent is supplied into the process chamber 201, in order to prevent intrusion of the oxidizing agent into the source gas supply pipe 213a and promote diffusion of the oxidizing agent in the process chamber 201, N$_2$ gas may be constantly released into the process chamber 201 with the valves ve1, ve2, ve3, vc1, vc2 and vc3 opened.

When a predetermined time has elapsed after the supply of the oxidizing agent into the process chamber 201 is initiated, the valves vg1, vg2 and vg3 are closed to stop the supply of the oxidizing agent into the process chamber 201.

[Purge Process (S5d)]

After the valves vg1, vg2 and vg3 are closed to stop the supply of the oxidizing agent, the valves vc1, vc2, vc3, ve1, ve2 and ve3 are maintained in an open state to continue the supply of the N$_2$ gas into the process chamber 201. The N$_2$ gas is dispersed by the shower head 240 to be supplied into the process chamber 201, and flows in the exhaust duct 259 to be exhausted to the exhaust port 260 and the exhaust pipe 261. Accordingly, the oxidizing agent or by-products remaining in the process chamber 201 are removed, and the inside of the process chamber 201 is purged by the N$_2$ gas.

[Predetermined-Time-Performed Process (S5e)]

The CVD-TaN layer forming process (S5a), the purge process (S5b), the oxidation process (S5c), and the purge process (S5d) are set as one cycle, and the cycle is performed at least one time, preferably a plurality of times to form the tantalum oxynitride film (TaN$_x$O$_y$ film) having a predetermined film thickness on the wafer 200. In addition, at this time, a conductive TaN$_x$O$_y$ film, in which oxygen (O) is stoichiometrically insufficient with respect to tantalum (Ta) and oxygen (O) is stoichiometrically insufficient with respect to nitrogen (N), is formed. According to the technique of this embodiment, it has been confirmed that a conductive TaN$_x$O$_y$ film having a ratio between oxygen and tantalum in the film ranging from 1:1 to 1:30 and a ratio between oxygen and nitrogen in the film ranging from 1:5 to 1:50 can be formed. Further, it has been confirmed that an oxygen concentration in the TaN$_x$O$_y$ film ranges from 1 to 15%. Furthermore, according to the technique of this embodiment, it has been confirmed that the TaN$_x$O$_y$ film having a resistance ranging from 1 to 10,000 mmΩ·cm can be formed.

In addition, a cycle number is determined by a target film thickness of the TaN$_x$O$_y$ film and a thickness of the CVD-TaN layer formed by each cycle. For example, provided that the target film thickness of the TaN$_x$O$_y$ film is 50 nm, when the thicknesses of the CVD-TaN layer formed by the respective cycles are 1 nm, 5 nm and 10 nm, the cycle numbers are 50, 10 and 5, respectively. Further, as described above, the thickness of the CVD-TaN layer formed by each cycle is appropriately determined according to the oxidizing power of the oxidizing agent, the target oxygen concentration, or the like.

Furthermore, in this embodiment, the source may be flowed in a pulse shape or may be continuously flowed, and the cycle of the CVD-TaN layer forming process (S5a), the purge process (S5b), the oxidation process (S5c), and the purge process (S5d) is performed one time, which corresponds to this case (the case in which the source is continuously supplied). However, when the TaN$_x$O$_y$ film having oxygen extremely insufficient with respect to the stoichiometric composition is formed, i.e., when a small quantity composition control in which a ratio between oxygen and nitrogen in the TaN$_x$O$_y$ film ranging from 1:5 to 1:50 is performed, the cycle should be repeated a plurality of times. That is, oxygen should be gradually doped onto a TaN layer by forming a thin TaN layer, slightly oxidizing the thin TaN layer, and repeating these processes a plurality of times. According to the above cyclic film-forming process, the TaN$_x$O$_y$ film having a uniform composition in a depth direction can be formed even when the small quantity composition control is performed. Meanwhile, when the cycle is performed only one time while the small quantity composition control is performed, a delicate control as when the cycle is performed a plurality of times is impossible, and the TaN$_x$O$_y$ film having the uniform composition in the depth direction cannot be easily formed.

[Remaining Gas Removal Process (S6)]

After the TaN$_x$O$_y$ film having a predetermined film thickness is formed on the wafer 200, a vacuum suction in the process chamber 201 is performed, the valves vc1, vc2, vc3, ve1, ve2 and ve3 are maintained in an open state, and the supply of N$_2$ gas into the process chamber is continued. The N$_2$ gas is dispersed by the shower head 240 to be supplied into the process chamber 201, and flows in the exhaust duct 259 to be exhausted to the exhaust port 260 and the exhaust pipe 261. Accordingly, the gas or by-products remaining in the process chamber 201 are removed, and the inside of the process chamber 201 is purged by the N$_2$ gas.

<Substrate Unloading Process (S7)>

Thereafter, according to a reverse sequence of the sequence of the above substrate loading process (S1) and the substrate placing process (S2), the wafer 200 after formation of the TaN$_x$O$_y$ film having a predetermined film thickness is unloaded from the process chamber 201 into the conveyance chamber 271, completing the substrate processing process in accordance with an embodiment of the present invention.

In addition, in this embodiment, processing conditions of the wafer 200 in the film-forming process (S5) of this embodiment are as follows:

Processing temperature (wafer temperature): 300 to 450° C.,

Processing pressure (pressure in process chamber): 20 to 1,330 Pa,

Flow rate of carrier gas for bubbling: 10 to 1,000 sccm,

[Source (TBTDET) gas supply flow rate: 10 to 200 sccm]

Nitrogen-containing gas (NH$_3$ gas) supply flow rate: 50 to 1,000 sccm,

Supply time of source gas and nitrogen-containing gas per each cycle: 10 seconds to 30 minutes, preferably, 10 to 600 seconds, Oxidizing agent (O$_2$ gas) supply flow rate: 10 to 500 sccm, Oxidizing agent supply time per each cycle: 10 to 600 seconds, Purge gas (N$_2$) supply flow rate: 1,000 to 3,000 sccm, Purge time per each cycle: 0.1 to 600 seconds, Cycle number: 1 to 400 times, Film thickness of TaN$_x$O$_y$ film: 10 to 50 nm.

In addition, in the above processing pressure range, when the processing temperature is less than 300° C., since the source TBTDET is not self-decomposed during the CVD-TaN layer forming process (S5a), a film-forming reaction by the CVD is not generated. Further, in the above processing pressure range, when the processing temperature is more than 450° C., since the film-forming rate is excessively increased, the film thickness cannot be easily controlled, and step coverage is decreased. Accordingly, in the CVD-TaN layer forming process (S5a), in order to generate the film-forming reaction by the CVD, enable the film thickness to be controlled, and improve the step coverage, the processing temperature must be controlled at a temperature ranging from 300° C. to 450° C. Further, it will be appreciated that, in the processing pressure range and the processing temperature range, the CVD-TaN layer can be thermally oxidized under a non-plasma atmosphere during the oxidation process (S5c), and it will be appreciated that, under the processing condition (oxidizing condition), the oxidation reaction of the CVD-TaN layer by the oxidizing agent is unsaturated. Accordingly, in this embodiment, the CVD-TaN layer forming process (S5a) and the oxidation process (S5c) are set to the same temperature range and the same pressure range and performed. As a result, provision of a process of changing a processing temperature or a process of changing a processing pressure between the CVD-TaN layer forming process (S5a) and the oxidation process (S5c) is not necessary, and throughput, i.e., productivity can be improved. Further, in consideration of improvement in productivity, while it is important that the CVD-TaN layer forming process (S5a) and the oxidation process (S5c) are performed at the same processing temperature range, variation in processing pressure exerts small influence on productivity. Accordingly, in the oxidation process (S5c), an optimal pressure range for oxidation treatment may be selected.

(3) Effects of the Embodiment

According to this embodiment, one or more effects represented below will be described.

(a) According to this embodiment, the CVD-TaN layer forming process (S5a) in which the CVD-TaN layer is formed on the wafer 200 and the oxidation process (S5c) in which the CVD-TaN layer is oxidized under a condition where the oxidation reaction is unsaturated are alternately performed a plurality of times. Accordingly, the conductive $TaN_xO_y$ film, in which oxygen (O) is stoichiometrically insufficient with respect to tantalum (Ta) and oxygen (O) is stoichiometrically insufficient with respect to nitrogen (N), i.e., a $TaN_xO_y$ film, in which oxygen is extremely insufficient with respect to a stoichiometric composition, can be formed. For example, according to the technique of this embodiment, a conductive $TaN_xO_y$ film having a ratio between oxygen and tantalum in the film ranging from 1:1 to 1:30 and a ratio between oxygen and nitrogen in the film ranging from 1:5 to 1:50 can be formed.

(b) In addition, according to this embodiment, the CVD-TaN layer forming process (S5a) in which the CVD-TaN layer is formed on the wafer 200 and the oxidation process (S5c) in which the CVD-TaN layer is oxidized under a condition where the oxidation reaction is unsaturated are alternately performed a plurality of times. Accordingly, the $TaN_xO_y$ film formed through the predetermined-time-performed process (S5e) can be uniformly oxidized in the thickness direction.

For example, when the target film thickness of the formed $TaN_xO_y$ film is 50 nm, while the CVD-TaN layer having a thickness of 50 nm is formed and the entire CVD-TaN layer having a thickness of 50 nm is intended to be oxidized by one oxidation process (S5c), according to the oxidizing power of the oxidizing agent, the surface of the CVD-TaN layer and the vicinity thereof are oxidized, but an inner side far from the surface may not be substantially oxidized. In this case, when the thickness of the CVD-TaN layer formed through the CVD-TaN layer forming process (S5a) is set to a small thickness of 5 nm and the cycle number in the predetermined-time-performed process (S5e) is 10, even under the condition where the oxidation reaction of the CVD-TaN layer by the oxidizing agent is unsaturated, the oxidation amount of the CVD-TaN layer can be increased, and the entire $TaN_xO_y$ film can be easily and uniformly oxidized in the thickness direction. That is, as the thickness of the CVD-TaN layer oxidized at every cycle is reduced and the formed CVD-TaN layer is easily oxidized, even under the condition where the oxidation reaction of the CVD-TaN layer by the oxidizing agent is unsaturated, the oxidation reaction of the CVD-TaN layer can be promoted and the entire $TaN_xO_y$ film can be uniformly oxidized in the thickness direction.

(c) According to the above-described embodiment, by varying the thickness of the CVD-TaN layer formed at every cycle, an oxygen concentration in the $TaN_xO_y$ film can be controlled and resistivity of the $TaN_xO_y$ film can be controlled.

For example, in the above case, the oxygen concentration in the $TaN_xO_y$ film can be increased by further reducing the thickness of the CVD-TaN layer formed through the CVD-TaN layer forming process (S5a) from 5 nm to 1 nm and increasing the cycle number in the predetermined-time-performed process (S5e) from 10 times to 50 times. That is, as the thickness of the CVD-TaN layer oxidized at each cycle is further reduced to more easily oxidize the CVD-TaN layer, each oxidation reaction of the CVD-TaN layer is further promoted so that the oxygen concentration in the $TaN_xO_y$ film can be increased and resistivity in the $TaN_xO_y$ film can be further increased.

In addition, for example, as the thickness of the CVD-TaN layer formed through the CVD-TaN layer forming process (S5a) is increased, for example, from 5 nm to 10 nm so that the cycle number in the predetermined-time-performed process (S5e) is decreased from 10 times to 5 times, oxygen in the $TaN_xO_y$ film is intentionally lost to reduce the oxygen concentration. That is, as the thickness of the CVD-TaN layer oxidized at each cycle is increased and the oxidation reaction of the CVD-TaN layer is suppressed to suppress the oxidizing amount of each CVD-TaN layer, the oxygen concentration in the $TaN_xO_y$ film can be reduced and the resistivity in the $TaN_xO_y$ can be reduced.

Further, for example, by varying the thickness of the CVD-TaN layer at each cycle, the oxygen concentration distribution in the $TaN_xO_y$ film can be arbitrarily varied in the thickness direction.

(d) In the CVD-TaN layer forming process (S5a) according to this embodiment, under a condition where the CVD reaction is caused, the source gas and the nitrogen-containing gas are supplied. As described above, as the CVD-TaN layer is formed using the CVD reaction, the step coverage of the CVD-TaN layer, i.e, the step coverage of the $TaN_xO_y$ film, can be improved. Further, by controlling the processing temperature ranging from 300 to 450° C. and the processing pressure ranging from 20 to 1,330 Pa, an excessive increase in film-forming rate can be suppressed while securely generating the film-forming reaction by the CVD, and the step coverage of the CVD-TaN layer, i.e., the step coverage of the $TaN_xO_y$ film, can be more securely improved.

(e) In the CVD-TaN layer forming process (S5a) according to this embodiment, under the condition where the CVD reaction is caused, the source gas and the nitrogen-containing gas are simultaneously supplied into the process chamber 201, in which the wafer 200 is accommodated. Then, the CVD-TaN layer, not the pyrolyzed tantalum layer, is formed on the wafer 200. Accordingly, since mixing of impurities into the CVD-TaN layer can be suppressed or the impurities can be removed from the CVD-TaN layer, an impurity concentration in the $TaN_xO_y$ film can be reduced and resistivity can be decreased.

In addition, A large amount of a carbon (C) element resulting from the source gas may be mixed as impurities into the pyrolyzed tantalum layer formed by pyrolyzing the source gas. For this reason, in the method of forming the tantalum oxide film, in which the process of pyrolyzing the source gas to form the pyrolyzed tantalum layer and the process of oxidizing the pyrolyzed tantalum layer by the oxidizing agent are set as one cycle, and the cycle is performed at least one time, the impurity concentration in the tantalum oxide film is increased and the resistivity is easily increased.

Further, in this embodiment, when the source gas is supplied into the process chamber 201, as the nitrogen-containing gas is also supplied therewith, mixing of the related impurities into the CVD-TaN layer can be suppressed or the related impurities can be removed from the CVD-TaN layer. That is, in the process of forming the CVD-TaN film on the wafer 200, i.e., in the process in which the CVD reaction proceeds, mixing of the impurities into the CVD-TaN layer can be suppressed by an action of the nitrogen-containing gas. Furthermore, at this time, even when the pyrolyzed tantalum layer is temporarily formed on the wafer 200, since the nitrogen-containing gas and the pyrolyzed tantalum layer can be reacted with each other, the impurities mixed into the pyrolyzed tantalum layer can be removed through the process in which the reaction proceeds, and the CVD-TaN layer having a small amount of impurities can be formed. Then, the impurity concentration in the $TaN_xO_y$ film can be reduced by actions thereof. In addition, in this embodiment, suppression of the mixing of the related impurities into the CVD-TaN layer or removal of the impurities from the CVD-TaN layer is performed at each cycle, and thus, the impurity concentration in the $TaN_xO_y$ film can be more securely reduced in the entire thickness direction. Further, the actions thereof are remarkably generated, in particular, when the organic sources such as TBTDET, TBTEMT and TBTDMT are used as sources.

(f) According to this embodiment, as the oxidation process (S5c) is performed, in addition to oxidation of the CVD-TaN layer, nitrogen can be removed from the CVD-TaN layer (i.e., $TaN_xO_y$ layer), and a nitrogen concentration in the $TaN_xO_y$ film can be reduced.

That is, in the oxidation process (S5c) according to this embodiment, the oxidizing agent supplied onto the wafer 200 separates at least some of Ta—N bonds included in the CVD-TaN layer. The nitrogen (N) atoms from which the tantalum (Ta) atoms are detached are removed from the CVD-TaN layer to be discharged as $N_2$, etc. Dangling bonds of the tantalum atoms remaining after the detaching of the nitrogen atoms are bonded to oxygen (O) atoms included in the oxidizing agent. Thus, the nitrogen is removed from the CVD-TaN layer, and thus, the nitrogen concentration in the $TaN_xO_y$ film formed through the predetermined-time-performed process (S5e) is reduced. Furthermore, in this embodiment, removal of the nitrogen from the CVD-TaN layer is performed at each cycle, and thus, the nitrogen concentration in the $TaN_xO_y$ film can be more securely reduced in the entire thickness direction.

In addition, removal of the nitrogen from the CVD-TaN layer can be promoted by increasing the oxidizing power of the oxidizing agent used in the oxidizing process (S5c), lengthening the oxidation time, or reducing the thickness of the CVD-TaN layer formed through the CVD-TaN layer forming process (S5a), and thus, the TaOx layer (i.e., TaOx film), in which nitrogen is not substantially included in the composition, can be formed. In this case, the conductive tantalum oxide film (TaOx film), in which oxygen (O) is stoichiometrically insufficient with respect to tantalum (Ta), is formed.

Another Embodiment of the Invention

Figure 7:
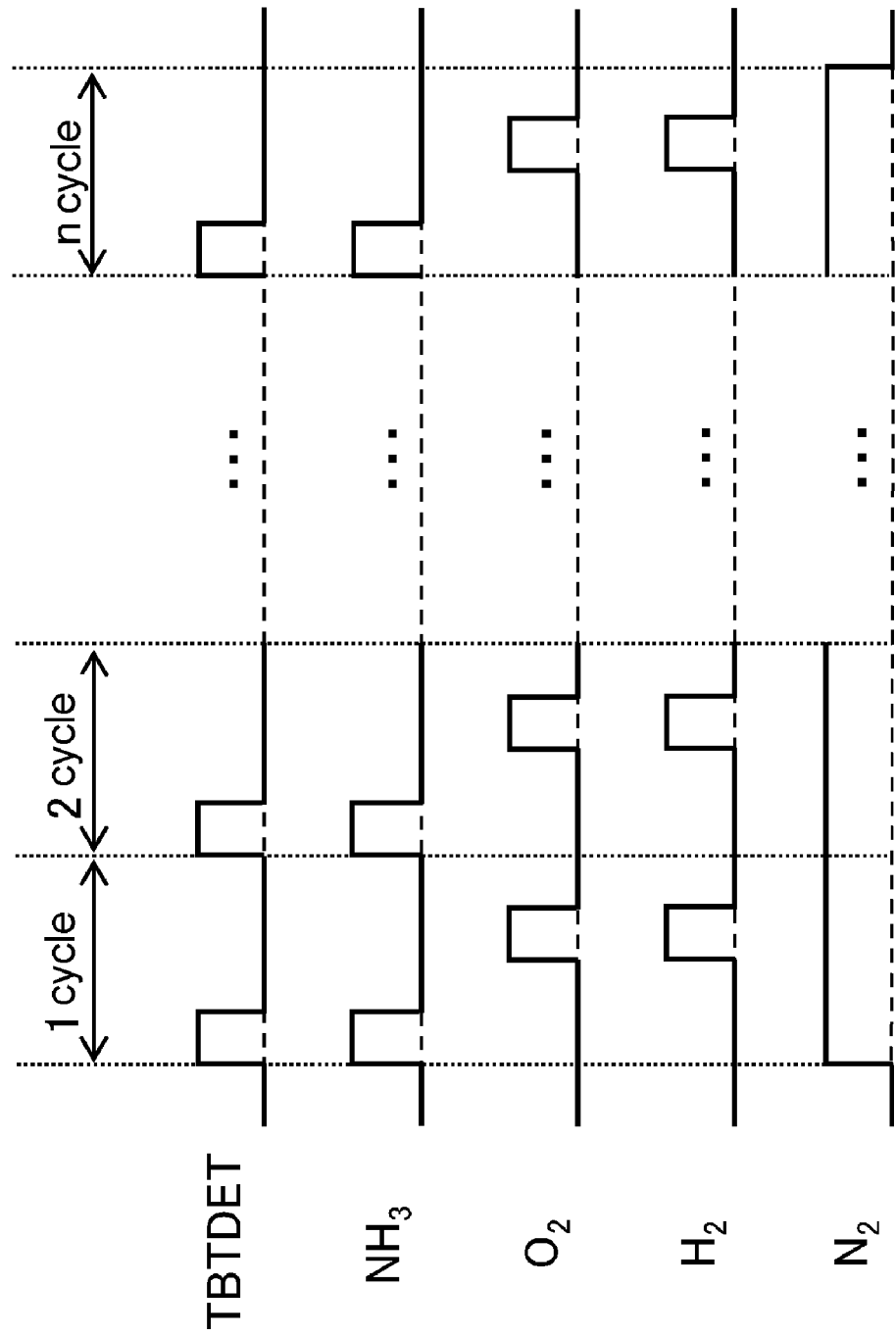
FIG. 7 is a timing chart of gas supply in a film forming process in accordance with another embodiment of the present invention, showing an example in which a mixed gas of oxygen gas and hydrogen gas is supplied as an oxidizing agent.

While the above-described embodiments describe an example in which oxygen ($O_2$) gas is solely used as an oxidizing agent, the present invention is not limited to the above-described embodiments. For example, a mixed gas of oxygen ($O_2$) gas, which is an oxygen-containing gas, and hydrogen ($H_2$) gas, which is a hydrogen-containing gas, may be used as an oxidizing agent. Hereinafter, an example in which the mixed gas of the $O_2$ gas and the $H_2$ gas is used as the oxidizing agent will be described. FIG. 7 is a timing chart of the gas supply of the film-forming process (S5) in the embodiment, showing an example in which the mixed gas of the oxygen gas and the hydrogen gas is supplied as the oxidizing agent. In addition, since this embodiment are different from the above-described embodiment in an aspect of the used oxidizing agent and the oxidation process (S5c), only the oxidation process (S5c) will be described herein. Further, the other processes are the same as in the above-described embodiments.

That is, in the oxidation process (S5c) according to this embodiment, the valves vh1, vh2 and vh3 are opened with the valves vg1, vg2 and vg3, and the mixed gas of the oxygen gas and the hydrogen gas is supplied into the process chamber 201. Then, the oxygen gas and the hydrogen gas are reacted with each other under a heated and decompressed atmosphere to generate oxidizing species including oxygen atoms such as atomic oxygen (O), and the CVD-TaN layer is oxidized using the oxidizing species. In addition, at least some of the Ta—N bonds included in the CVD-TaN layer are separated by energy of the oxidizing species. The nitrogen atoms from which the tantalum atoms are detached are removed from the CVD-TaN layer to be discharged as $N_2$, etc. Further, dangling bonds of the tantalum atoms remaining after the detaching of the nitrogen atoms are bonded to the oxygen atoms included in the oxidizing species. Thus, the nitrogen is removed from the CVD-TaN layer, and thus, the nitrogen concentration in the $TaN_xO_y$ film formed through the predetermined-time-performed process (S5e) can be reduced.

According to the oxidation treatment using the mixed gas of the oxygen gas and the hydrogen gas under the heated and decompressed atmosphere (hereinafter, $O_2+H_2$ oxidation treatment), oxidation of the CVD-TaN layer can be further promoted, removal of the nitrogen atoms from the CVD-TaN layer can be promoted, and a nitrogen concentration reduction effect in the $TaN_xO_y$ film formed through the predetermined-time-performed process (S5e) can be further improved.

Further, comparing the $O_2+H_2$ oxidation treatment, the oxidation treatment using only the oxygen gas as the oxidizing agent (hereinafter, $O_2$ oxidation treatment), and the oxidation treatment using only ozone ($O_3$) gas as the oxidizing agent (hereinafter $O_3$ oxidation treatment), it has been confirmed that, at a temperature range of 400° C. or higher, the oxidizing power by the $O_2+H_2$ oxidation treatment is larger than the oxidizing power by the $O_2$ oxidation treatment and the oxidizing power by the $O_3$ oxidation treatment. Furthermore, while the $O_2$ oxidation treatment or the $O_3$ oxidation treatment has a nitrogen concentration reduction effect, it has been confirmed that, at the temperature range of 400° C. or higher, the $O_2+H_2$ oxidation treatment has a hydrogen concentration reduction effect higher than that of the $O_2$ oxidation treatment or the $O_3$ oxidation treatment. That is, it will be appreciated that the $O_2+H_2$ oxidation treatment is very effective at that temperature range. In addition, while the $O_3$ oxidation treatment requires an ozonizer, the $O_2+H_2$ oxidation treatment does not require the ozonizer and has a merit such as reduction in equipment cost in comparison with the $O_3$ oxidation treatment.

Still Another Embodiment of the Invention

While the above-described embodiment has been described as an example of the substrate processing apparatus (film-forming apparatus) in which a film is formed using a single-wafer processing CVD apparatus configured to process one substrate at a time, the present invention is not limited thereto. For example, a film may be formed using a batch-type vertical CVD apparatus, which is a substrate processing apparatus configured to process a plurality of substrates at a time. Hereinafter, the vertical CVD apparatus will be described.

Figure 5A:
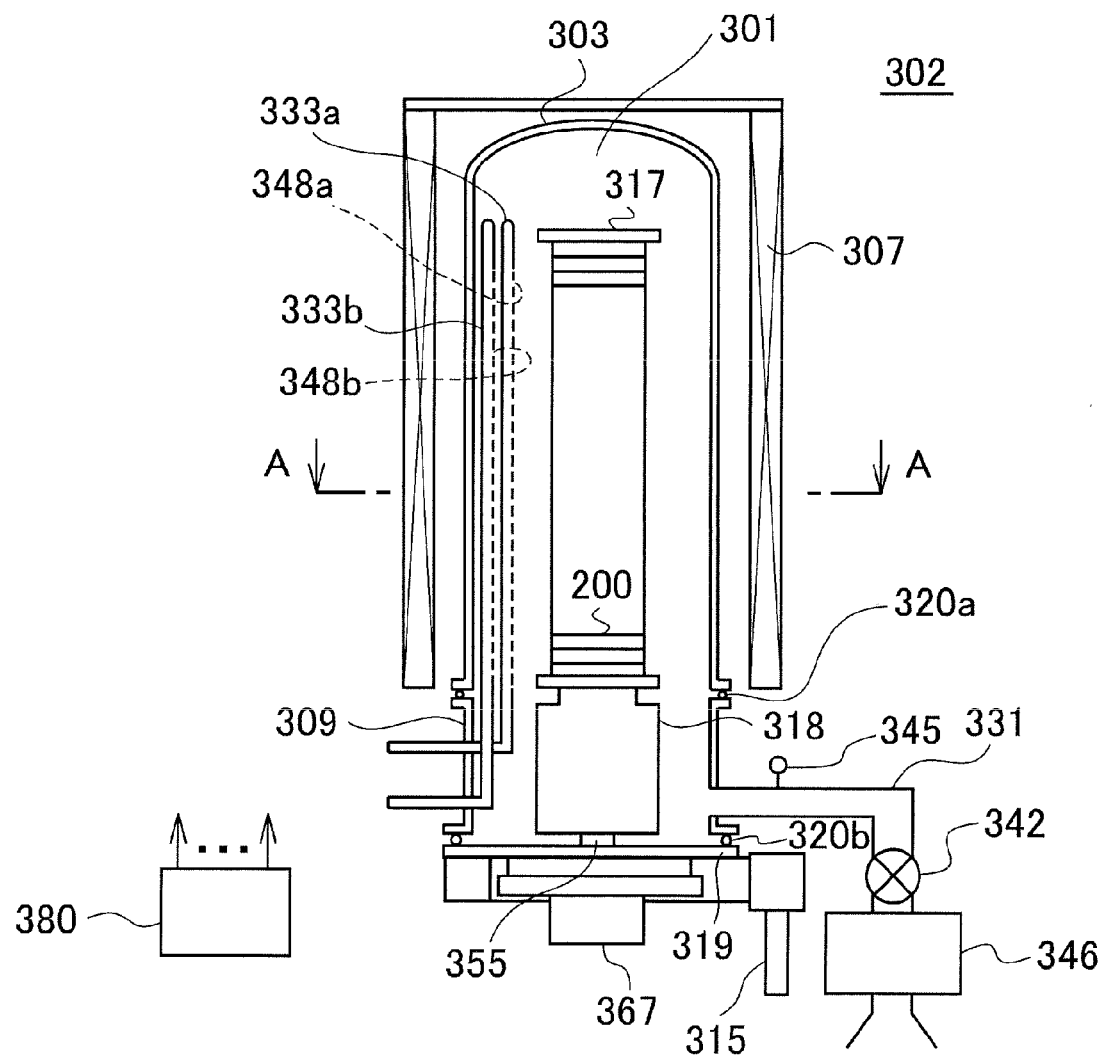
FIGS. 5A and 5B are schematic configuration views of a vertical process furnace of a vertical CVD apparatus used in another embodiment of the present invention, FIG. 5A showing a longitudinal cross-sectional view of a process furnace 302, and FIG. 5B showing a cross-sectional view of the process furnace 302 taken along line A-A of FIG. 5A.
Figure 5B:
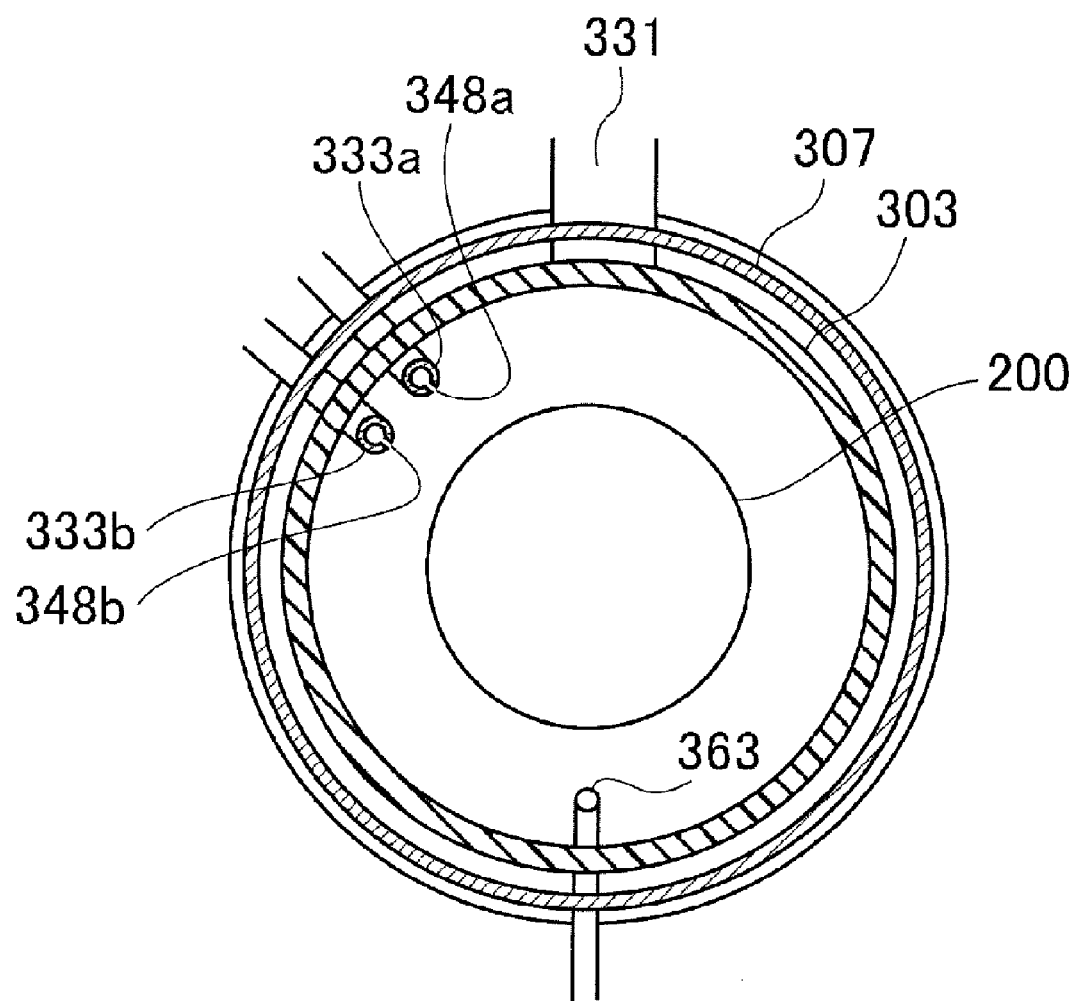

FIGS. 5A and 5B are schematic configuration views of a vertical process furnace of a vertical CVD apparatus preferably used in another embodiment of the present invention, FIG. 5A showing a longitudinal cross-sectional view of a process furnace 302, and FIG. 5B showing a cross-sectional view of the process furnace 302 taken along line A-A of FIG. 5A.

As shown in FIG. 5A, the process furnace 302 includes a heater 307, which is a heating means (heating mechanism). The heater 307 is supported and vertically installed by a heater base having a cylindrical shape and acting as a holding plate.

A process tube 303, which is a reaction tube, is disposed inside the heater 307 to be concentric with the heater 307. The process tube 303 is formed of a heat-resistant material such as quartz ($SiO_2$) or silicon carbide (SiC), and has a cylindrical shape with an upper end closed and a lower end opened. A process chamber 301 is formed in a cylindrical hollow part of the process tube 303, and the process chamber 301 is configured to accommodate the wafers 200, which are substrates, disposed in a horizontal posture and vertically aligned in a multi-stage by a boat 317 (described later).

A manifold 309 is disposed under the process tube 303 to be concentric with the process tube 303. The manifold 309 is formed of, for example, stainless steel, and has a cylindrical shape with upper and lower ends opened. The manifold 309 is engaged with the process tube 303 and installed to support the process tube 303. In addition, an O-ring 320a, which is a seal member, is installed between the manifold 309 and the process tube 303. As the manifold 309 is supported by the heater base, the process tube 303 is vertically installed. A reaction vessel is defined by the process tube 303 and the manifold 309.

A first nozzle 333a acting as a first gas introduction part and a second nozzle 333b acting as a second gas introduction part are connected to the manifold 309 to pass through a sidewall of the manifold 309. The first nozzle 333a and the second nozzle 333b have L-shaped members, each of which has a horizontal part and a vertical part. The horizontal part is connected to the manifold 309, and the vertical part is vertical installed in an arc-shaped space between an inner wall of the process tube 303 and the wafer 200 along the inner wall of the process tube 303 from a lower part to an upper part thereof in a stacking direction of the wafer 200. A first gas supply hole 348a and a second gas supply hole 348b, which are supply holes configured to supply a gas, are installed at side surfaces of the vertical parts of the first nozzle 333a and the second nozzle 333b, respectively. The first gas supply hole 348a and the second gas supply hole 348b have the same opening area from a lower part to an upper part thereof, and are installed at the same opening pitch.

A gas supply system connected to the first nozzle 333a and the second nozzle 333b is the same as in the above-described embodiment. However, this embodiment is distinguished from the above-described embodiment in that a source gas supply system is connected to the first nozzle 333a, and a nitrogen-containing gas supply system and an oxidizing agent supply system (an oxygen-containing gas supply system and a hydrogen-containing gas supply system) are connected to the second nozzle 333b. That is, in this embodiment, the source gas, the nitrogen-containing gas and the oxidizing agent are supplied by the respective nozzles. In addition, the source gas, the nitrogen-containing gas and the oxidizing agent may be supplied by the same nozzle.

An exhaust pipe 331 configured to exhaust an atmosphere in the process chamber 301 is installed at the manifold 309. A vacuum pump 346, which is a vacuum exhaust apparatus, is connected to the exhaust pipe 331 via a pressure sensor 345 acting as a pressure detector and an APC valve 342 acting as a pressure regulator, and configured to vacuum exhaust the process chamber 301 such that the pressure in the process chamber 301 reaches a predetermined pressure (vacuum level) by adjusting the APC valve 342 based on pressure information detected by the pressure sensor 345. In addition, the APC valve 342 is an opening/closing valve configured to open/close the valve, with the vacuum pump 346 in operation, such that vacuum-exhaustion of the inside of the process chamber 301 can be initiated or stopped, and adjust a valve opening angle, with the vacuum pump 346 in operation, such that the pressure in the process chamber 301 can be regulated.

A seal cap 319, which is a furnace port cover, is installed under the manifold 309 to hermetically seal a lower aperture of the manifold 309. The seal cap 319 is configured to contact a lower end of the manifold 309 from a lower side in a vertical direction. The seal cap 319 is formed of a metal such as stainless steel, and formed in a disc shape. An O-ring 320b, which is a seal member, is installed at an upper surface of the seal cap 319 to contact the lower end of the manifold 309. A rotary mechanism 367 is installed at a side of the seal cap 318 opposite to the process chamber 310 to rotate the boat 317 (described later). A rotary shaft 355 of the rotary mechanism 367 is connected to the boat 317 through the seal cap 319, and configured to rotate the boat 317 and thus rotate the wafer 200. The seal cap 319 is configured to be vertically raised and lowered by a boat elevator 315, which is an elevation mechanism disposed outside the process tube 303, and thus, the boat 317 can be loaded into or unloaded from the process chamber 301.

The boat 317, which is a substrate holder, is formed of a heat-resistant material such as quartz or silicon carbide, and configured to hold the plurality of wafers 200 disposed in a horizontal posture and concentrically arranged in a multi-stage. In addition, a heat-resistant member 318 formed of a heat-resistant material such as quartz or silicon carbide is installed at a lower part of the boat 317 such that heat from the heater 307 cannot be easily transferred to the seal cap 319. A temperature sensor 363, which is a temperature detector, is installed in the process tube 303 such that the temperature in the process chamber 301 reaches a predetermined temperature distribution by adjusting a conduction state to the heater 307 based on temperature information detected by the temperature sensor 363. The temperature sensor 363 is installed along the inner wall of the process tube 303, similar to the first nozzle 333a and the second nozzle 333b.

A controller 380, which is a control unit (control means), controls operations of the APC valve 342, the heater 307, the temperature sensor 363, the vacuum pump 346, the rotary mechanism 367, the boat elevator 315, the valves va1 to va5, vb1 to vb3, vc1 to vc3, ve1 to ve3, vg1 to vg3 and vh1 to vh3, and the MFCs 222a, 222b, 222c, 222e, 222g and 222h.

Next, a substrate processing process of forming a $TaN_xO_y$ film on the wafer 200 using the process furnace 302 of the vertical CVD apparatus according to the above configuration will be described as one of processes of manufacturing a semiconductor device. In addition, in the following description, operations of the respective parts constituting the vertical CVD apparatus are controlled by the controller 380.

The plurality of wafers 200 are charged to the boat 317 (wafer charging). Then, as shown in FIG. 5A, the boat 317 on which the plurality of wafers 200 are held is raised by the boat elevator 315 to be loaded into the process chamber (boat loading). In this state, the seal cap 319 seals the lower end of the manifold 309 via the O-ring 320b.

The inside of the process chamber 301 is vacuum-exhausted by the vacuum pump 346 such that the inside of the process chamber 301 reaches a desired pressure (vacuum level). At this time, the pressure in the process chamber 301 is measured by the pressure sensor 345, and the APC valve 342 is feedback-controlled based on the measured pressure information. In addition, the inside of the process chamber 301 is heated by the heater 307 to a desired temperature. At this time, a conduction state to the heater 307 is feedback-controlled based on the temperature information detected by the temperature sensor 363 such that the inside of the process chamber 301 reaches a desired temperature distribution. Then, rotation of the wafer 200 is initiated by the rotary mechanism 367.

Thereafter, in the same sequence as the film-forming process (S5) of the above-described embodiment, the $TaN_xO_y$ film having a predetermined thickness is formed on the wafer 200. That is, the CVD-TaN layer forming process (S5a) through which the CVD-TaN layer is formed on the wafer 200, by supplying TBTDET gas, which is a source gas including tantalum, and $NH_3$ gas, which is a nitriding agent, into the process chamber 301, in which the wafer 200 is accommodated, under a condition where the CVD reaction is caused, the purge process (S5b) through which the source gas, the nitriding agent, and the by-products remaining in the process chamber 301 are removed, the oxidation process (S5c) through which $O_2$ gas is supplied into the process chamber 301 as the oxidizing agent to oxidize the CVD-TaN layer under a condition where the oxidation reaction of the CVD-TaN layer by the oxidizing agent is unsaturated, and the purge process (S5d) through which the oxidizing agent or the by-products remaining in the process chamber 301 are removed, which are set as one cycle, and the cycle is performed a predetermined number of times (S5e), so that the conductive $TaN_xO_y$ film in which oxygen (O) is stoichiometrically insufficient with respect to tantalum (Ta) and nitrogen (N) is formed on the wafer 200. After the $TaN_xO_y$ film having a predetermined thickness is formed on the wafer 200, a remaining gas removal process is performed in the same sequence as the remaining gas removal process (S6) of the above-described embodiment.

Thereafter, the seal cap 319 is lowered by the boat elevator 315 to open the lower end of the manifold 309, and with the wafer 200 being held on the boat 317 after the $TaN_xO_y$ film having a predetermined thickness is formed, the boat 317 is unloaded from the lower end of the manifold 30 to the outside of the process tube 303 (boat unloading). Next, the processed wafer 200 is discharged from the boat 317 (wafer discharging).

Still Another Embodiment of the Invention

Figure 13:
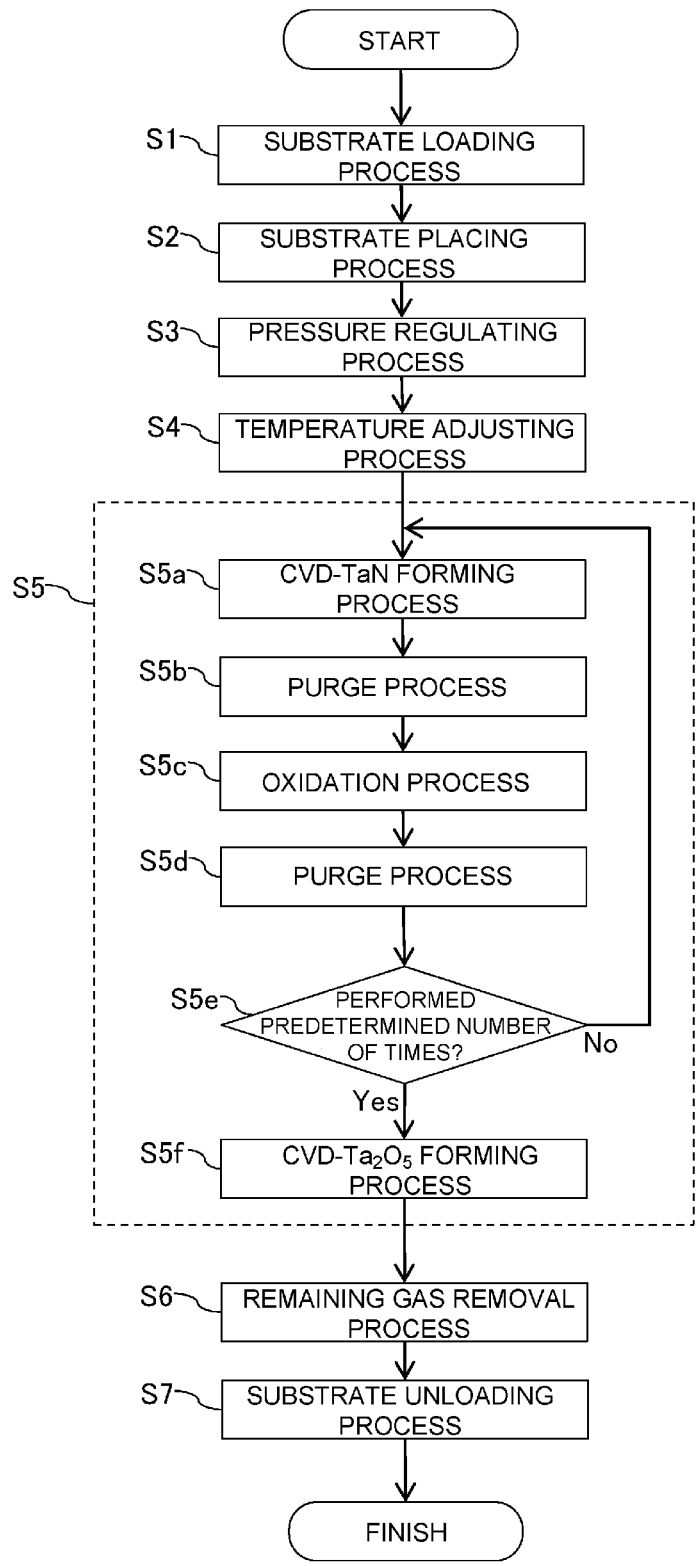
FIG. 13 is a flowchart of a substrate processing process in accordance with still another embodiment of the present invention.
Figure 14:
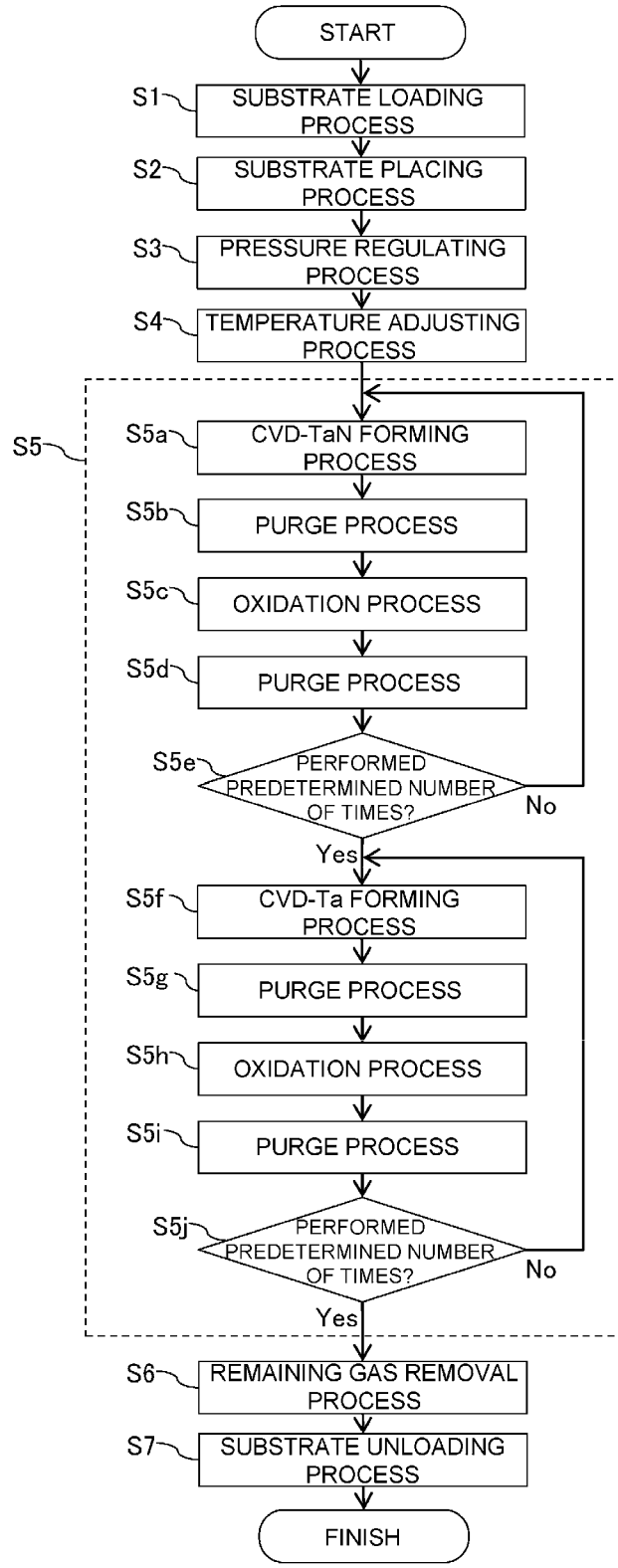
FIG. 14 is a flowchart of a substrate processing process in accordance with yet another embodiment of the present invention.
Figure 15:
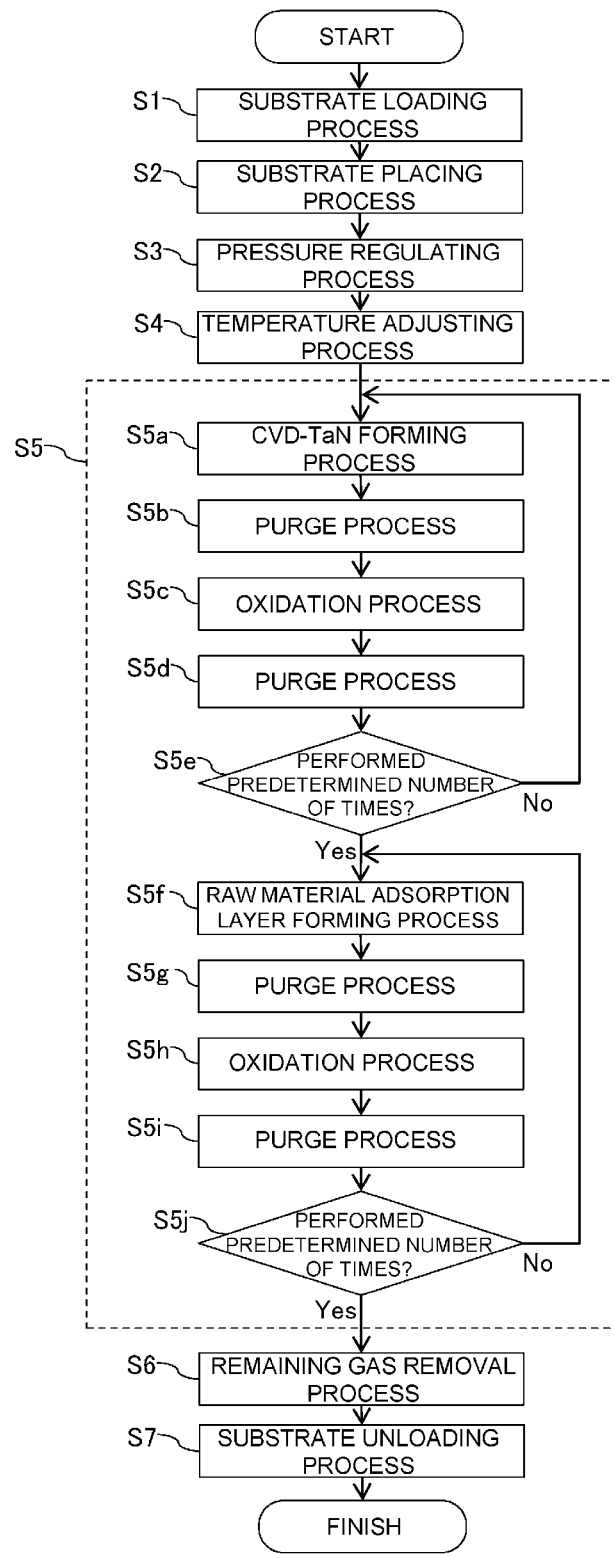
FIG. 15 is a flowchart of a substrate processing process in accordance with yet another embodiment of the present invention.

While the above-described embodiment has been described as an example in which the conductive $TaN_xO_y$ film in which oxygen (O) is stoichiometrically insufficient with respect to tantalum and nitrogen is formed on the wafer in the process chamber, the present invention is not limited thereto. For example, as shown in FIGS. 13, 14 and 15, after the conductive $TaN_xO_y$ film in which oxygen (O) is stoichiometrically insufficient with respect to tantalum and nitrogen is formed on the wafer in the process chamber, with the wafer being accommodated in the process chamber after forming the $TaN_xO_y$ film, not discharging from the process chamber, an insulating tantalum oxide film ($Ta_2O_5$ film) may be continuously formed on the $TaN_xO_y$ film in the same process chamber. That is, the conductive $TaN_xO_y$ film and the insulating $Ta_2O_5$ film may be continuously formed on the wafer in the process chamber in situ.

In addition, the $Ta_2O_5$ film may be formed by supplying the source gas including tantalum and the oxidizing agent into the process chamber in which the wafer after forming the $TaN_xO_y$ film is accommodated, under a condition where the CVD reaction is caused. In this case, the source gas and the oxidizing agent may be supplied from the source gas supply system and the oxidizing agent supply system, respectively, which are described above. The source gas and the oxidizing agent may be simultaneously or alternately supplied.

When the source gas and the oxidizing agent are simultaneously supplied, a CVD-$Ta_2O_5$ film is formed on the $TaN_xO_y$ film (see FIG. 13). At this time, the processing temperature (wafer temperature) and the processing pressure (pressure in the process chamber) become a processing temperature and a processing pressure at which the source gas is self-decomposed, and in the process chamber or on the surface of the wafer, a gas phase reaction between the source gas and the oxidizing agent occurs and the CVD-$Ta_2O_5$ film is formed on the $TaN_xO_y$ film. At this time, under a condition where the $Ta_2O_5$ film having a stoichiometric composition is formed, a CVD film-forming process is performed.

Further, when the source gas and the oxidizing agent are alternately supplied, formation of a CVD-Ta layer on the $TaN_xO_y$ film and oxidation of the CVD-Ta layer by the oxidizing agent are alternately performed to form the $Ta_2O_5$ film on the $TaN_xO_y$ film (see FIG. 14). At this time, the oxidation is performed under a condition where the oxidation reaction of the CVD-Ta layer by the oxidizing agent is saturated. In this case, as shown in FIG. 14, the process of supplying the source gas and the process of supplying the oxidizing agent may be alternately repeated a plurality of times with the process of purging the inside of the process chamber interposed therebetween. That is, a cycle constituted by the source gas supply process, the purge process, the oxidizing agent supply process, and the purge process may be repeated a plurality of times.

Furthermore, when the source gas and the oxidizing agent are alternately supplied, formation of a source adsorption layer (a chemical adsorption layer of a source) on the $TaN_xO_y$ film and oxidation of the source adsorption layer by the oxidizing agent may be alternately performed to form the $Ta_2O_5$ film on the $TaN_xO_y$ film (see FIG. 15). At this time, the oxidation is performed under a condition where the oxidation reaction of the source adsorption layer by the oxidizing agent is saturated. In this case, as shown in FIG. 15, the process of supplying the source gas and the process of supplying the oxidizing agent may be alternately repeated a plurality of times with the process of purging the inside of the process chamber interposed therebetween. That is, a cycle constituted by the source gas supply process, the purge process, the oxidizing agent supply process, and the purge process may be repeated a plurality of times.

The same source gas as in the above-described embodiment may be used as the source gas, and the same oxidizing agent as in the above-described embodiment may be used as the oxidizing agent. However, the oxidizing agent having an oxidizing power higher than that of the oxidizing agent used when the $TaN_xO_y$ film is formed may be used as the oxidizing agent. When the $TaN_xO_y$ film is formed, the oxidation of the CVD-TaN layer is needed under the condition where the oxidation reaction of the CVD-TaN layer by the oxidizing agent is unsaturated. However, when the $Ta_2O_5$ film is formed, there is no such need, and the film should be formed under the condition where the oxidation reaction is saturated. In addition, as the oxidizing agent having a high oxidizing power is used, an effect of suppressing the mixing of the impurities into the CVD-$Ta_2O_5$ film or an effect of removing the impurities from the CVD-Ta layer or the source adsorption layer can be increased, and a film-forming rate can also be increased. For example, $O_2$ gas may be used as the oxidizing agent when the $TaN_xO_y$ film is formed, and $O_3$ or $O_2+H_2$ may be used as the oxidizing agent when the $Ta_2O_5$ film is formed.

When the CVD-Ta$_2$O$_5$ film is formed by simultaneously supplying the source gas and the oxidizing agent, the processing conditions are as follows:

Processing temperature (wafer temperature): 300 to 450° C.,

Processing pressure (pressure in process chamber): 20 to 1,330 Pa,

Supply flow rate of carrier gas for bubbling: 10 to 1,000 sccm, (Source gas supply flow rate: 10 to 200 sccm)

Oxidizing agent supply flow rate: 10 to 1,000 sccm,

Film thickness of Ta$_2$O$_5$ film: 1 to 50 nm.

In addition, when formation of the CVD-Ta layer and oxidation of the CVD-Ta layer are alternately performed by alternately supplying the source gas and the oxidizing agent to form the Ta$_2$O$_5$ film, the processing conditions are as follows:

Processing temperature (wafer temperature): 300 to 450° C.,

Processing pressure (pressure in process chamber): 20 to 1,330 Pa,

Supply flow rate of carrier gas for bubbling: 10 to 1,000 sccm, (Source gas supply flow rate: 10 to 200 sccm)

Source gas supply time per cycle: 10 seconds to 30 minutes, preferably, 10 to 600 seconds, Oxidizing agent (O$_3$ gas) supply flow rate: 10 to 1,000 sccm, Oxidizing agent supply time per cycle: 10 to 600 seconds, Purge gas (N$_2$) supply flow rate: 500 to 3,000 sccm, Purge time per cycle: 0.1 to 600 seconds, Cycle number: 1 to 400 times, Film thickness of Ta$_2$O$_5$ film: 1 to 50 nm.

Further, when formation of the source adsorption layer and oxidation of the source adsorption layer are alternately performed by alternately supplying the source gas and the oxidizing agent to form the Ta$_2$O$_5$ film, the processing conditions are as follows:

Processing temperature (wafer temperature): 200 to 400° C.,

Processing pressure (pressure in process chamber): 20 to 1,330 Pa,

Supply flow rate of carrier gas for bubbling: 10 to 1,000 sccm, (Source gas supply flow rate: 10 to 200 sccm)

Source gas supply time per cycle: 10 seconds to 30 minutes, preferably, 10 to 600 seconds, Oxidizing agent (O$_3$ gas) supply flow rate: 10 to 1,000 sccm, Oxidizing agent supply time per cycle: 10 to 600 seconds, Purge gas (N$_2$) supply flow rate: 500 to 3,000 sccm, Purge time per cycle: 0.1 to 600 seconds, Cycle number: 1 to 1000 times, Film thickness of Ta$_2$O$_5$ film: 1 to 50 nm.

In either of a case in which the source gas and the oxidizing agent are simultaneously supplied and a case in which the source gas and the oxidizing agent are alternately supplied, the TaN$_x$O$_y$ film and the Ta$_2$O$_5$ film can be formed at the same processing temperature range and the same processing pressure range. In addition, even when the Ta$_2$O$_5$ film is formed, similar to the formation of the TaN$_x$O$_y$ film, operations of the respective parts constituting the substrate processing apparatus are controlled by the controller to perform the film-forming process.

As described above, after the conductive TaN$_x$O$_y$ film is formed on the wafer in the process chamber, with the wafer being accommodated in the process chamber after the TaN$_x$O$_y$ film is formed, the insulating Ta$_2$O$_5$ film is continuously formed on the TaN$_x$O$_y$ film in situ. Accordingly, even when the wafer after the TaN$_x$O$_y$ film and the Ta$_2$O$_5$ film are formed is discharged from the process chamber to the outside, the Ta$_2$O$_5$ film acts as a barrier layer to prevent exposure of the TaN$_x$O$_y$ film to the atmosphere. That is, while the TaN$_x$O$_y$ film is likely to be affected by oxygen and to be oxidized due to exposure to the atmosphere, the Ta$_2$O$_5$ film is formed on the surface thereof to act as an oxygen blocking layer, preventing oxidation of the surface. Accordingly, deterioration in film characteristics of the TaN$_x$O$_y$ film can be prevented.

Example 1

Verification of Film-Forming Rate by CVD Method

Film-forming rates of a tantalum film (Comparative Example) formed by the CVD method by supplying only the TBTDET gas into the process chamber, a tantalum film (Comparative Example) formed by the CVD method by simultaneously supplying the TBTDET gas and H$_2$ gas into the process chamber, and a tantalum nitride film (Example) formed by the CVD method by simultaneously supplying the TBTDET gas and NH$_3$ gas into the process chamber were measured. Each of the films was formed by using the substrate process apparatus described in the above-described embodiment. In all cases, the processing pressure was 100 Pa, and the processing temperature varied ranging from 350 to 450° C. In addition, a temperature in a bubbler in which the TBTDET was accommodated was 100° C., a flow rate of a carrier gas used for bubbling was 100 sccm, and flow rates of H$_2$ gas and NH$_3$ gas were 300 sccm. In addition, a SiN film (under layer film) was previously formed on the wafer, which is an under layer for growth, a film thickness of which was 100 nm.

Figure 8:
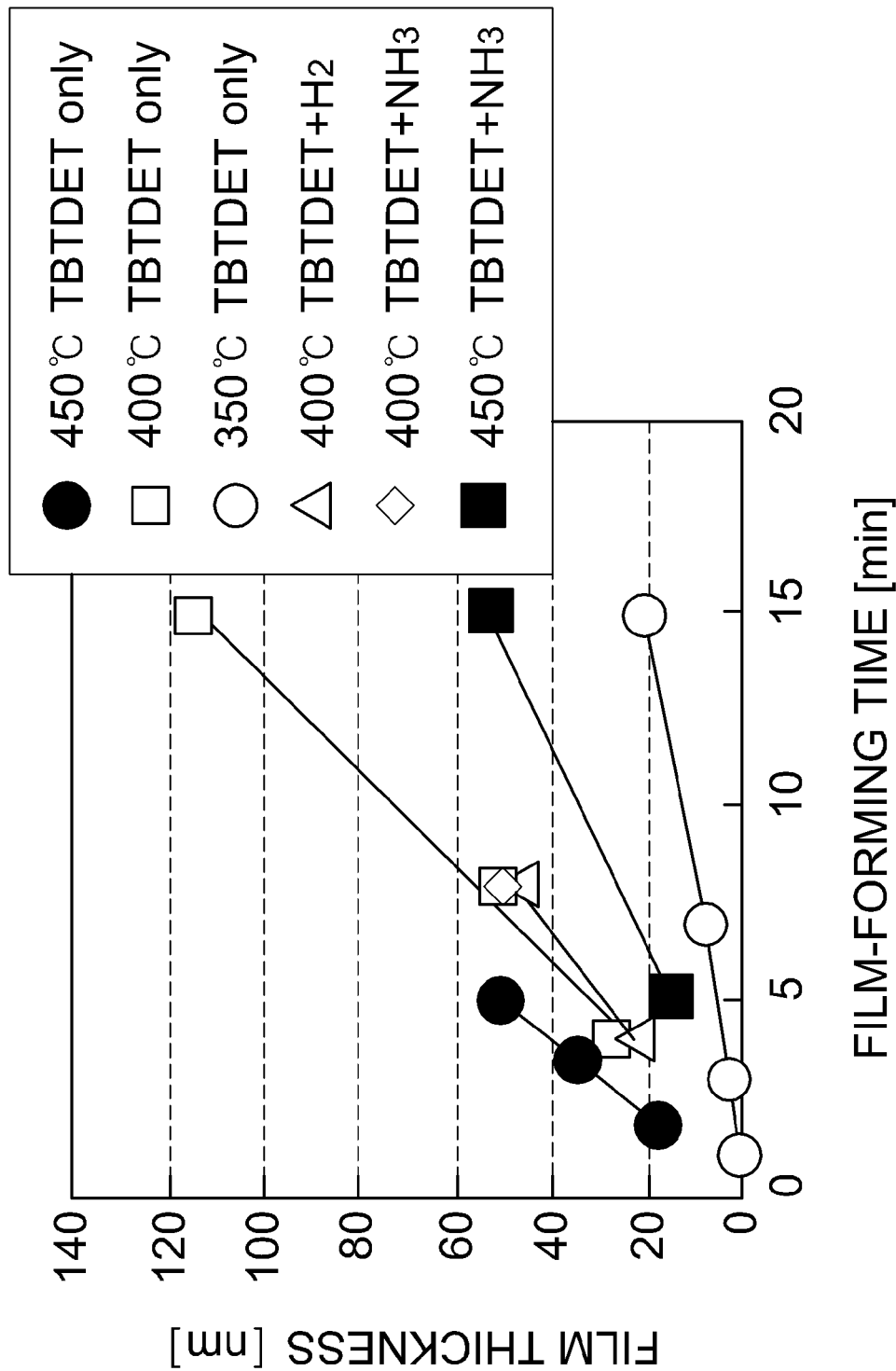
FIG. 8 is a graph showing a film forming rate of a tantalum nitride film in accordance with an example 1 of the present invention together with a comparative example.

FIG. 8 is a graph showing a film-forming rate of the tantalum nitride film according to this Example and a film-forming rate of the tantalum film according to the Comparative Example. A horizontal axis of FIG. 8 represent a film-forming time, i.e., supply times (min) of TBTDET gas, H$_2$ gas, and NH$_3$ gas. A vertical axis of FIG. 8 represents a film thickness (nm) of the tantalum film or the tantalum nitride film formed on the wafer. In addition, marks ●, □ and ○ (Comparative Example) of FIG. 8 represent tantalum films formed by the CVD method by supplying only the TBTDET gas at processing temperatures of 450° C., 400° C. and 350° C., respectively. Further, a mark Δ (Comparative Example) of FIG. 8 represents a tantalum film formed by the CVD method by simultaneously supplying the TBTDET gas and H$_2$ gas at a processing temperature ranging from 400° C. Marks ◇ and ■ (Example) of FIG. 8 represent tantalum nitride films formed by the CVD method by simultaneously supplying the TBTDET gas and NH$_3$ gas at processing temperatures of 400° C. and 350° C.

Referring to FIG. 8, it can be seen that there is no large difference between film-forming rates at the processing temperature ranging from 400° C. or lower. That is, it will be appreciated that the film forming rate does not vary even when the NH$_3$ gas is mixed with the TBTDET gas. In addition, the film-forming rate is slightly decreased by mixing the NH$_3$ gas with the TBTDET gas at the processing temperature ranging from 450° C. (mark ■). This is because a gas phase reaction in the process chamber (i.e., a gas phase reaction at a place spaced apart from the wafer surface) is increased.

Example 2

Verification of Resistivity

Resistivity of the tantalum film (Comparative Example) formed by the CVD method by supplying only the TBTDET gas and the tantalum nitride film (Example) formed by the CVD method by simultaneously supplying the TBTDET gas and $NH_3$ gas were measured. Each of the films was formed by using the substrate processing apparatus described in the above-described embodiment. Film thicknesses of the tantalum film and the tantalum nitride film were 50 nm. The other processing conditions were the same as Example 1.

Figure 9:
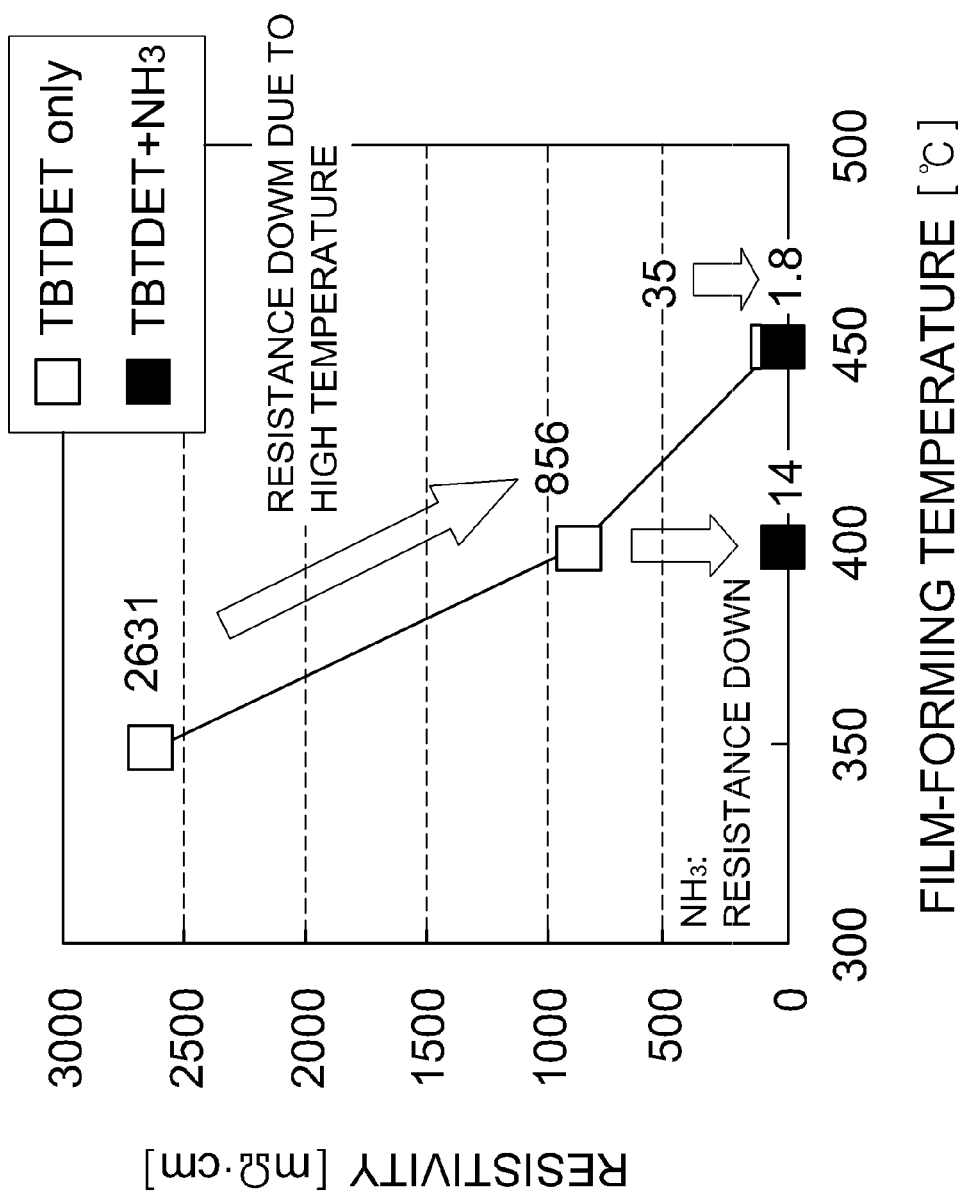
FIG. 9 is a graph showing a resistivity of a tantalum nitride film in accordance with an example 2 of the present invention together with a comparative example.

FIG. 9 is a graph showing resistivity of the tantalum nitride film according to the Example together with the Comparative Example. A horizontal axis of FIG. 9 represents the processing temperature, i.e., a wafer temperature (° C.). A vertical axis of FIG. 9 represents resistivity (mΩ·cm) of the tantalum film or the tantalum nitride film formed on the wafer. In addition, a mark □ (Comparative Example) of FIG. 9 represents the tantalum film formed by the CVD method by supplying only the TBTDET gas. A mark ■ (Example) of FIG. 9 represents the tantalum nitride film formed by the CVD method by simultaneously supplying the TBTDET gas and $NH_3$ gas.

Referring to FIG. 9, it can be seen that resistivity of the tantalum nitride film (mark ■) formed by the CVD method by simultaneously supplying the TBTDET gas and $NH_3$ gas is remarkably smaller than that of the tantalum film (mark □) formed by the CVD method by supplying only the TBTDET gas. That is, it will be appreciated that the impurity concentration in the tantalum nitride film can be remarkably reduced by mixing the $NH_3$ gas with the TBTDET gas, and thus, the resistivity can be remarkably reduced. In addition, when the processing temperature of the Comparative Example is increased to 350° C., 400° C. and 450° C., the resistivity is decreased to 2631 mΩ·cm, 856 mΩ·cm and 35 mΩ·cm, and when the processing temperature of the Example is increased to 400° C. and 450° C., the resistivity is reduced to 14 mΩ·cm and 1.8 mΩ·cm. That is, in any case, it will be appreciated that the resistivity is decreased when the processing temperature is increased.

Example 3

Verification of Impurity Concentration

Resistivity of the tantalum film (Comparative Example) formed by the CVD method by supplying only the TBTDET gas and the tantalum nitride film (Example) formed by the CVD method by simultaneously supplying the TBTDET gas and $NH_3$ gas were verified. Each of the films was formed by using the substrate processing apparatus described in the above-described embodiment. The processing temperature was 400° C., and the film thicknesses of the tantalum film and the tantalum nitride film were 50 nm. The other processing conditions were the same as Example 1.

Figure 10:
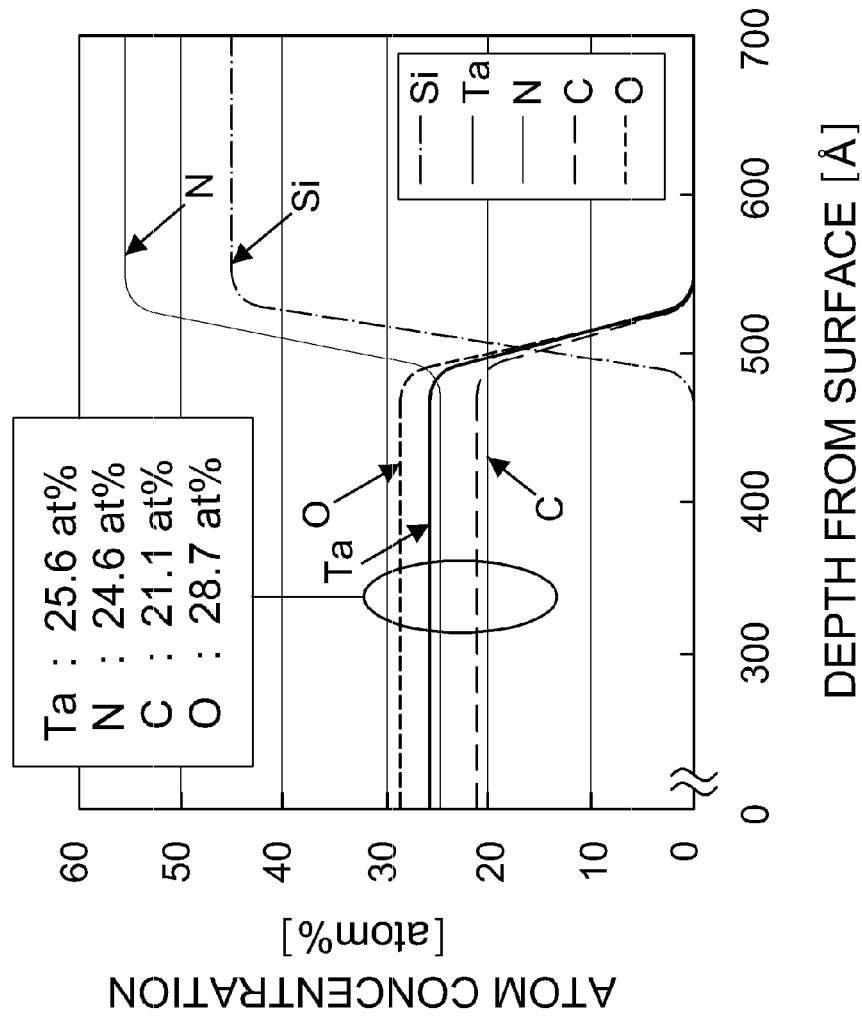
FIG. 10 is a graph showing composition of a tantalum film according to a comparative example.
Figure 11:
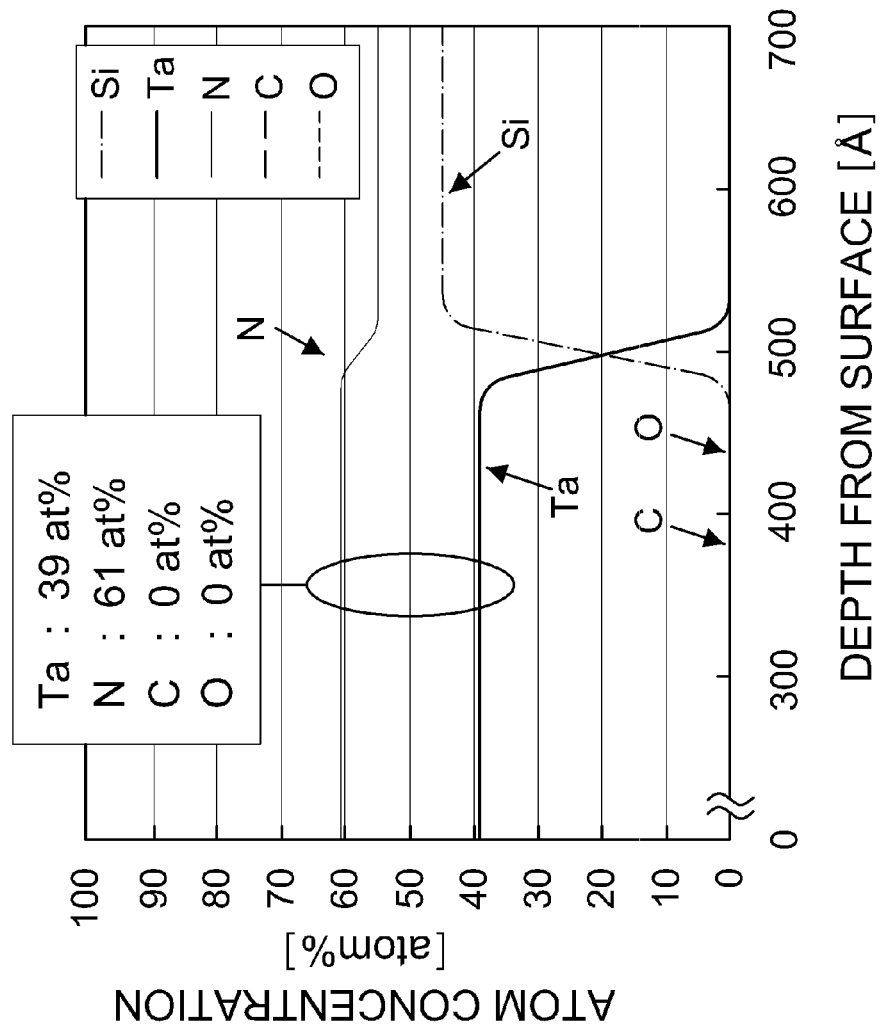
FIG. 11 is a graph showing composition of a tantalum nitride film in accordance with an example 3 of the present invention.

FIG. 10 is a graph showing composition of the tantalum film according to the Comparative Example, and FIG. 11 is a graph showing composition of the tantalum nitride film according to the Example. Horizontal axes of FIGS. 10 and 11 represent a depth (Å) of the tantalum film or the tantalum nitride film from the surface. Vertical axes of FIGS. 10 and 11 represent an atom concentration (atom %) measured by an X-ray fluorescence spectrometer (XRF).

Referring to FIG. 10 (Comparative Example), it can be seen that an atom concentration of tantalum is 25.6 atom %, and atom concentrations of nitrogen, carbon, and oxygen are 24.6, 21.1 and 28.7 atom % respectively, in a region having a depth ranging from 0 to 500 Å. That is, it will be appreciated that a large amount of nitrogen (N), carbon (C) and oxygen (O) resulting from the TBTDET gas are mixed into the tantalum film formed by supplying only the TBTDET gas.

In contrast, as shown in FIG. 11 (Example), it can be seen that atom concentrations of tantalum and nitrogen are 39 and 61 atom % respectively, and atom concentrations of carbon and oxygen are 0 atom % in a region having a depth ranging from 0 to 500 Å. That is, it will be appreciated that the impurities such as carbon (C) and oxygen (O) are nearly not mixed into the tantalum nitride film formed by simultaneously supplying the TBTDET gas and $NH_3$ gas.

Accordingly, it will be appreciated that the impurities in the tantalum nitride film can be removed and the impurity concentration of the tantalum nitride film can be remarkably reduced by mixing the $NH_3$ gas with the TBTDET gas. In addition, it will be appreciated that resistivity of the tantalum film (thickness of 50 nm) shown in FIG. 10 is 856 mΩ·cm, resistivity of the tantalum nitride film (thickness of 50 nm) shown in FIG. 11 is 14 mΩ·cm, and the resistivity is remarkably reduced as the impurity concentration is reduced.

Example 4

Relation Between Oxygen Concentration, Resistivity and Cycle Number

Using the substrate processing apparatus described in the above-described embodiment, the CVD-TaN layer forming process (S5a), the purge process (S5b), the oxidation process (S5c) and the purge process (S5d) were set as one cycle, and the cycle was performed at least one time to form the $TaN_xO_y$ film having a predetermined film thickness on the wafer. In addition, the processing pressure was 100 Pa, the processing temperature was 325° C., the temperature in the bubbler in which the TBTDET was accommodated was 100° C., the flow rate of the carrier gas for bubbling was 100 sccm, the flow rate of the $NH_3$ gas was 300 sccm, the flow rate of the $O_2$ gas as the oxidizing agent was 200 sccm, and the supply time of the oxidizing agent at each cycle was 5 seconds. Further, the film thickness of the formed $TaN_xO_y$ film was fixed to 50 nm, the thicknesses of the CVD-TaN layer formed at each cycle were varied at 50 nm, 25 nm, 16.7 nm and 8.3 nm, the cycle numbers were varied at 1 time, 2 times, 3 times and 6 times to prepare test samples, and oxygen concentration and resistivity of each case were measured.

Figure 12:
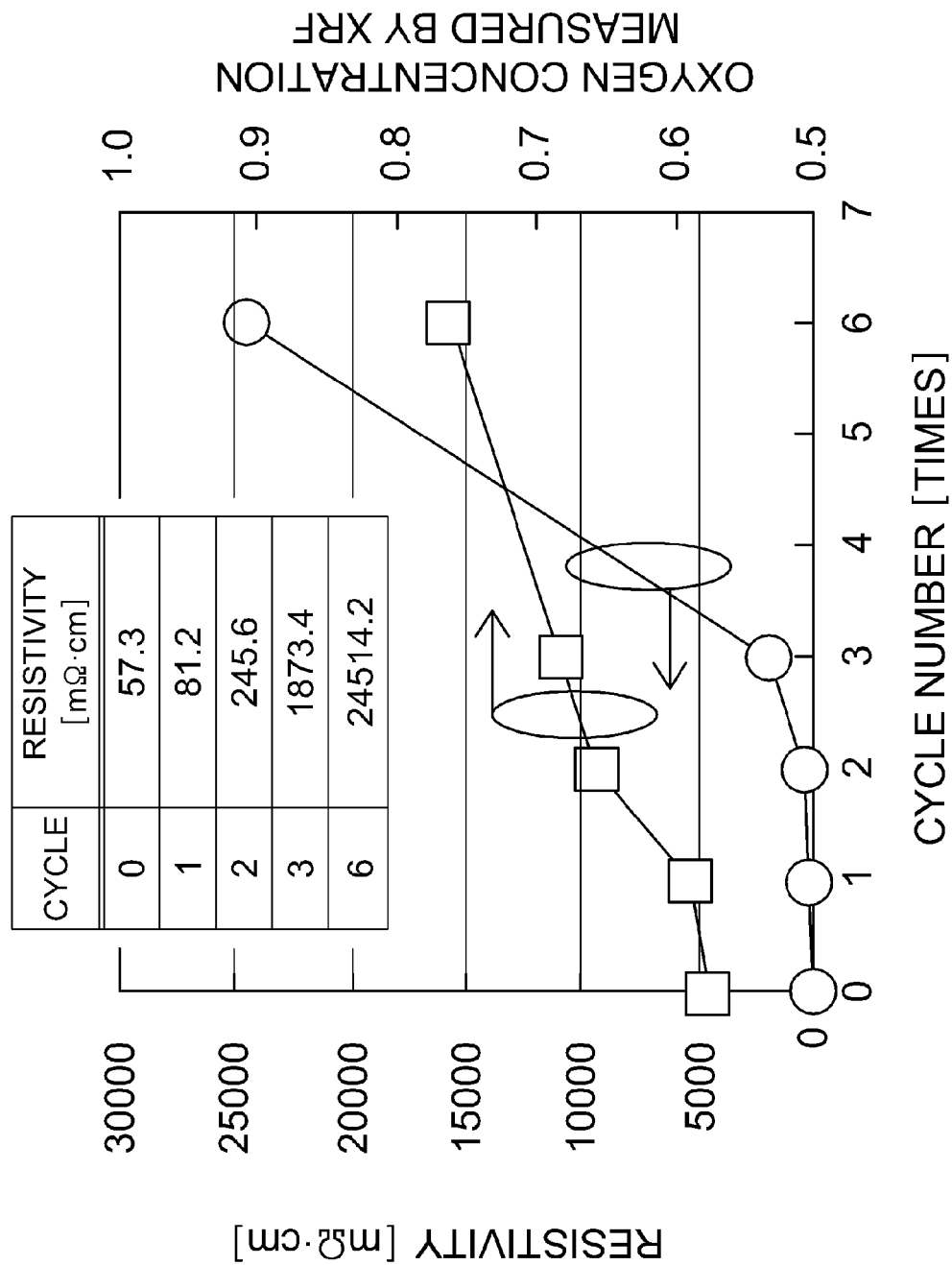
FIG. 12 is a graph showing a relationship between oxygen concentration, resistivity and cycle number of a tantalum oxynitride film in accordance with an example 4 of the present invention.

FIG. 12 is a graph showing a relationship between the oxygen concentration, resistivity and cycle number of the $TaN_xO_y$ film according to the Example. A horizontal axis of FIG. 12 represents the cycle number (times) in the predetermined-time-performed process (S5e). A right vertical axis of FIG. 12 represents oxygen intensity (i.e., oxygen concentration) of the $TaN_xO_y$ film measured by the XRF, and a left vertical axis of FIG. 12 represents the resistivity (mΩ·cm) of the $TaN_xO_y$ film. In addition, in FIG. 12, the cycle number 0 represents the case (Reference Example) that the oxidation process (S5c) is not performed after the CVD-TaN layer forming process (S5a).

Referring to FIG. 12, it can be seen that, as the thickness of the CVD-TaN layer formed at each cycle is reduced and the cycle number is increased, the oxygen intensity (oxygen concentration) of the $TaN_xO_y$ film is increased (see the mark □ of the drawing) and the resistivity is also increased (see the mark ○ of the drawing). That is, it will be appreciated that the oxygen concentration in the $TaN_xO_y$ film can be controlled and the resistivity can be controlled by varying the thickness of the CVD-TaN layer formed at each cycle and the cycle number. For example, the oxygen in the $TaN_xO_y$ can be intentionally lost to decrease the resistivity of the $TaN_xO_y$ film by increasing the thickness of the CVD-TaN layer formed at each cycle.

Preferred Aspects of the Invention

Hereinafter, preferred aspects of the present invention will be additionally stated.

According to one aspect of the present invention, there is provided a method of manufacturing a semiconductor device, which includes:

forming a tantalum nitride layer on a substrate by supplying a source gas including a tantalum and a nitriding agent into a process chamber wherein the substrate is accommodated under a condition where a chemical vapor deposition (CVD) reaction is caused;

oxidizing the tantalum nitride layer by supplying an oxidizing agent into the process chamber under a condition where an oxidation reaction of the tantalum nitride layer by the oxidizing agent is unsaturated; and forming on the substrate a conductive tantalum oxynitride film wherein an oxygen is stoichiometrically insufficient with respect to the tantalum and a nitrogen by alternately repeating forming the tantalum nitride layer on the substrate and oxidizing the tantalum nitride layer a plurality of times.

Preferably, the source gas may include a butyl imino group.

In addition, preferably, the source gas may include a tertiary butyl imino group.

Further, preferably, the source gas may further include at least one of an ethyl group and a methyl group, and an amino group.

Furthermore, preferably, the source gas may include at least one of $Ta[NC(CH_3)_3][N(C_2H_5)_2]_3$, $Ta[NC(CH_3)_3][N(C_2H_5)CH_3]_3$ and $Ta[NC(CH_3)_3][N(CH_3)_2]_3$.

In addition, preferably, the nitriding agent may include at least one of $NH_3$, $N_2H_2$, $N_2H_4$ and $N_3H_8$.

Further, preferably, the oxidizing agent may include at least one of $O_2$, $O_3$, $H_2O$ and $O_2+H_2$.

Furthermore, preferably, a ratio between the oxygen and the tantalum contained in the conductive tantalum oxynitride film may range from 1:1 to 1:30.

In addition, preferably, a ratio between the oxygen and the nitrogen contained in the conductive tantalum oxynitride film may range from 1:1 to 1:50.

Further, preferably, the method may further include, after forming the conductive tantalum oxynitride film, with the substrate having the conductive tantalum oxynitride film formed thereon being accommodated in the process chamber, forming an insulating tantalum oxide film on the conductive tantalum oxynitride film by supplying the source gas including the tantalum and the oxidizing agent into the process chamber.

Furthermore, preferably, the method may further include, after forming the conductive tantalum oxynitride film, with the substrate having the conductive tantalum oxynitride film formed thereon being accommodated in the process chamber, continuously forming an insulating tantalum oxide film on the conductive tantalum oxynitride film in situ.

In addition, preferably, in oxidizing the tantalum nitride layer, the tantalum nitride layer may be thermally oxidized under a non-plasma atmosphere.

Further, preferably, the method may further include controlling an oxygen concentration in the conductive tantalum oxynitride film by controlling the thickness of the tantalum nitride layer formed in each process of forming the tantalum nitride layer.

Furthermore, preferably, in forming the conductive tantalum oxynitride film, the temperature of the substrate may range from 300 to 450° C., and the pressure in the process chamber may range from 20 to 1330 Pa.

According to another aspect of the present invention, there is provided a method of processing a substrate, which includes:

forming a tantalum nitride layer on a substrate by supplying a source gas including a tantalum and a nitriding agent into a process chamber wherein the substrate is accommodated under a condition where a chemical vapor deposition (CVD) reaction is caused;

oxidizing the tantalum nitride layer by supplying an oxidizing agent into the process chamber under a condition where an oxidation reaction of the tantalum nitride layer by the oxidizing agent is unsaturated; and forming on the substrate a conductive tantalum oxynitride film wherein an oxygen is stoichiometrically insufficient with respect to the tantalum and a nitrogen by alternately repeating forming the tantalum nitride layer on the substrate and oxidizing the tantalum nitride layer a plurality of times.

According to still another aspect of the present invention, there is provided a substrate processing apparatus, which includes:

a process chamber configured to accommodate a substrate;

a heater configured to heat the substrate in the process chamber;

a source gas supply system configured to supply a source gas including a tantalum into the process chamber;

a nitriding agent supply system configured to supply a nitriding agent into the process chamber;

an oxidizing agent supply system configured to supply an oxidizing agent into the process chamber; and a control unit configured to control the heater, the source gas supply system, the nitriding agent supply system and the oxidizing agent supply system to perform forming a tantalum nitride layer on the substrate by supplying the source gas and the nitriding agent into the process chamber wherein the substrate is accommodated under a condition where a chemical vapor deposition (CVD) reaction is caused; oxidizing the tantalum nitride layer by supplying the oxidizing agent into the process chamber under a condition where an oxidation reaction of the tantalum nitride layer by the oxidizing agent is unsaturated; and forming on the substrate a conductive tantalum oxynitride film wherein the oxygen is stoichiometrically insufficient with respect to the tantalum and the nitrogen by alternately repeating forming the tantalum nitride layer on the substrate and oxidizing the tantalum nitride layer a plurality of times.

While the embodiments of the present invention have been described in detail, the present invention is not limited thereto but may be often modified without departing from the spirit of the invention.

What is claimed is:

1. A method of manufacturing a semiconductor device, comprising:

(a) forming on a substrate a conductive tantalum oxide film wherein oxygen is stoichiometrically insufficient with respect to tantalum by alternately repeating: supplying a source gas including the tantalum and a nitriding agent into a process chamber wherein the substrate is accommodated under a condition where a chemical vapor deposition (CVD) reaction is caused to form a tantalum nitride layer on the substrate; and supplying an oxidizing agent into the process chamber to oxidize the tantalum nitride layer under a condition where an oxidation reaction of the tantalum nitride layer by the oxidizing agent is unsaturated while removing nitrogen from the tantalum nitride layer;

(b) supplying the source gas including the tantalum and the oxidizing agent into the process chamber with the substrate having the conductive tantalum oxide film formed thereon being accommodated in the process chamber after performing the step (a) to form an insulating tantalum oxide film on the conductive tantalum oxide film; and (c) unloading the substrate having the conductive tantalum oxide film and the insulating tantalum oxide film formed thereon from the process chamber.

2. The method according to claim 1, wherein the source gas comprises a butyl imino group.

3. The method according to claim 1, wherein the source gas comprises a tertiary butyl imino group.

4. The method according to claim 2, wherein the source gas further comprises at least one of an ethyl group and a methyl group, and an amino group.

5. The method according to claim 3, wherein the source gas further comprises at least one of an ethyl group and a methyl group, and an amino group.

6. The method according to claim 1, wherein the source gas comprises at least one of $Ta[NC(CH_3)_3][N(C_2H_5)_2]_3$, $Ta[NC(CH_3)_3][N(C_2H_5)CH_3]_3$ and $Ta[NC(CH_3)_3][N(CH_3)_2]_3$.

7. The method according to claim 6, wherein the nitriding agent comprises at least one of $NH_3$, $N_2H_2$, $N_2H_4$ and $N_3H_8$, and the oxidizing agent comprises at least one of $O_2$, $O_3$, $H_2O$ and $O_2+H_2$.

8. The method according to claim 1, wherein the insulating tantalum oxide film is continuously formed on the conductive tantalum oxide film in the process chamber after forming the conductive tantalum oxide film in the step (a) without unloading the substrate from the process chamber.

9. The method according to claim 1, wherein the conductive tantalum oxide film and the insulating tantalum oxide film are continuously formed in the process chamber.

10. The method according to claim 1, wherein the conductive tantalum oxide film and the insulating tantalum oxide film are continuously formed in-situ.

11. The method according to claim 1, wherein the oxidizing agent comprises $O_2+H_2$.

12. The method according to claim 1, wherein the oxidizing agent comprises $O_3$.

13. The method according to claim 1, wherein further comprising exposing the substrate to an atmosphere after the conductive tantalum oxide film and the insulating tantalum oxide film are formed.

14. The method according to claim 13, wherein the insulating tantalum oxide film serves as a barrier layer preventing the conductive tantalum oxide film from being exposed to the atmosphere when the substrate is exposed to the atmosphere.

* * * * *